(12) United States Patent
Mizuno et al.

(10) Patent No.: US 7,990,208 B2
(45) Date of Patent: *Aug. 2, 2011

(54) VOLTAGE SUPPLY WITH LOW POWER AND LEAKAGE CURRENT

(75) Inventors: Hiroyuki Mizuno, Tokyo (JP); Kiyoo Itoh, Higashikurume (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/591,146

(22) Filed: Nov. 10, 2009

(65) Prior Publication Data

US 2010/0052775 A1  Mar. 4, 2010

Related U.S. Application Data

(63) Continuation of application No. 11/493,612, filed on Jul. 27, 2006, now Pat. No. 7,639,068, which is a continuation of application No. 10/923,708, filed on Aug. 24, 2004, now Pat. No. 7,145,383, which is a continuation of application No. 10/290,291, filed on Nov. 8, 2002, now Pat. No. 6,836,179.

(30) Foreign Application Priority Data

Nov. 30, 2001 (JP) ............................... P2001-365539

(51) Int. Cl.
*G05F 1/575* (2006.01)
*G11C 11/4074* (2006.01)
(52) U.S. Cl. ......... 327/544; 327/543; 327/546; 365/227
(58) Field of Classification Search .................. None
See application file for complete search history.

(56) References Cited

U.S. PATENT DOCUMENTS 5,583,457 A  12/1996  Horiguchi et al.
(Continued)

FOREIGN PATENT DOCUMENTS

JP           11-195975           12/1997
(Continued)

OTHER PUBLICATIONS

Jerry M. Soden, Charles F. Hawkins, Anthony C. Miller, "Identifying Defects in Deep-Submicron CMOS ICs", IEEE Spectrum, Sep. 1996, pp. 66-71.

(Continued)

*Primary Examiner* — Lincoln Donovan
*Assistant Examiner* — Terry L Englund
(74) *Attorney, Agent, or Firm* — Stites & Harbison PLLC; Juan Carlos A. Marquez, Esq.

(57) ABSTRACT

In a semiconductor integrated circuit device, a circuit block has a first MOS transistor, and a leakage current control circuit having a second MOS transistor and a current source, a source and drain circuit of the second MOS transistor is formed between the power supply line of the circuit block and a voltage point where operating voltage is supplied. This current source is connected to the power supply line and in a first state, the power supply line is driven to a first voltage by the second MOS transistor. In a second state, the power supply line is controlled at a second voltage by current flow in the current source and, the voltage applied across the source and drain of the first MOS transistor in the second state is smaller than the voltage applied across the source and drain of the first MOS transistor in the first state.

14 Claims, 26 Drawing Sheets

U.S. PATENT DOCUMENTS

| | | | |
|---|---|---|---|
| 5,939,909 | A | 8/1999 | Callahan, Jr. |
| 6,091,656 | A | 7/2000 | Ooishi |
| 6,184,744 | B1 | 2/2001 | Morishita |
| 6,208,177 | B1 | 3/2001 | Knoedl, Jr. |
| 6,313,694 | B1 | 11/2001 | Sohn |
| 6,333,571 | B1 | 12/2001 | Teraoka et al. |
| 6,414,895 | B2 | 7/2002 | Kokubo et al. |
| 6,556,071 | B2 | 4/2003 | Notani et al. |
| 6,624,672 | B2 * | 9/2003 | Confaloneri et al. ......... 327/112 |
| 6,836,179 | B2 | 12/2004 | Mizuno et al. |
| 6,980,048 | B2 | 12/2005 | Kwon |
| 7,061,301 | B2 | 6/2006 | Pham |
| 7,145,383 | B2 | 12/2006 | Mizuno et al. |
| 7,639,068 | B2 * | 12/2009 | Mizuno et al. ................ 327/541 |
| 7,710,168 | B2 * | 5/2010 | Bapat ............................ 327/108 |
| 2003/0102903 | A1 | 6/2003 | Cho |

FOREIGN PATENT DOCUMENTS

| | | |
|---|---|---|
| JP | 2001-284530 | 3/2000 |

OTHER PUBLICATIONS

Hironori Akamatsu, Toru Iwata, Hiro Yamamoto, Takashi Hirata, Hiroyuki Yamauchi, Hisakazu Kotani and Akira Matsuzawa, "A Low Power Data Holding Circuit with an Intermittent Power Supply Scheme for sub-1V MT-CMOS LSIs", IEEE, 1996 Symposium on VLSI Circuits Digest of Technical Papers, pp. 14-15.

Kouichi Kumagai, Hiroaki Iwaki, Hiroshi Yoshida, Hisamitsu Suzuki, Takashi Yamada and Susumu Kurosawa, "A Novel Powering-down Scheme for Low Vt CMOS Circuits", IEEE, 1998 Symposium on VLSI Circuits Digest of Technical Papers, pp. 44-45.

* cited by examiner

VOLTAGE SUPPLY WITH LOW POWER AND LEAKAGE CURRENT

CROSS-REFERENCE TO RELATED APPLICATIONS

This application is a Continuation application of U.S. application Ser. No. 11/493,612 filed Jul. 27, 2006 (now U.S. Pat. No. 7,639,068), which is a Continuation of application of U.S. application Ser. No. 10/923,708 filed Aug. 24, 2004, now issued as U.S. Pat. No. 7,145,383, which is a Continuation of U.S. application Ser. No. 10/290,291 filed Nov. 8, 2002, now issued as U.S. Pat. No. 6,836,179. Priority is claimed based on U.S. application Ser. No. 11/493,612 filed Jul. 27, 2006, which claims the priority of U.S. application Ser. No. 10/923,708 filed Aug. 24, 2004, which claims the priority of U.S. application Ser. No. 10/290,291 filed Nov. 8, 2002 which claims the priority of Japanese Patent Application No. 2001-365539 filed Nov. 30, 2001, all of which is incorporated by reference.

FIELD OF THE INVENTION

The present invention relates to a semiconductor integrated circuit device and relates in particular to a semiconductor integrated circuit device with excellent high speed and low power operation characteristics.

BACKGROUND OF THE INVENTION

As the chip manufacturing process progresses towards making smaller and finer chip circuitry, the different leakage currents within the chip, including the subthreshold leakage current, gate tunneling leakage current and GIDL (Gate-Induced Drain Leakage) current increase as described in "Identifying defects in deep-submicron CMOS ICs", IEEE Spectrum, pp. 66-71, September, 1996 (hereafter referred to as reference 1). These leakage currents increase the electrical current consumption of the chip.

A method for reducing subthreshold leakage current in the related art is disclosed in "A Low Power Data Holding Circuit with an Intermittent Power Supply Scheme", Symposium on VLSI Circuits Digest of Technical Papers, pp. 14-15, 1996 (hereafter referred to as reference 2). In the method of reference 2, a power switch composed of MOS transistors having a threshold voltage with an absolute value sufficiently higher than the absolute values of threshold voltages of MOS transistors comprising the circuit block, is inserted in series with the circuit block power supply between power and ground. Here, the term MOS transistor is used in these specifications as a general term to describe an insulated gate type field effect transistor. Also, the power supply voltage supplied to the circuit is defined as having a high voltage (potential) and low voltage (potential). However, this is used here to respectively express the power supply as the high voltage potential and the ground as the low voltage potential. While the chip is in standby (idle), the subthreshold leakage current flowing through the circuit block is cut off by turning this power switch off. Usually, setting this power switch to off, erases the information stored in the information retention circuits (in circuits with a volatile information holding function for example; static memories, flip-flops, latches and register files, etc.) within the circuit block because the supply of power to the circuit blocks is cut off. In fact however, a particular time (TR) is required before the information within the information retention circuits is erased after setting the power switch to off. The method in reference 2 therefore turns the power switch on once again before the time TR elapses after the power switch was turned off (Hereafter, the operation of turning the power supply on once again is called the refresh operation.) Then, the power supply switch is turned off after a fixed amount of time, and this process is repeated to prevent information within the information retention circuit from being erased and to reduce the amount of current consumption in the circuit block due to subthreshold leakage current.

A method disclosed in "A Novel Powering-down Scheme for Low Vt CMOS Circuits", Symposium on VLSI Circuits Digest of Technical Papers, pp. 44-45, 1998 (hereafter referred to as reference 3) has the same power switch and circuit block connections as in reference 2. In the method of reference 3, a diode is connected in series with the power switch to clamp (reduce) to a lower level the excess voltage (voltage differential between power and ground) supplied to the circuit block while the power switch is on and prevent the loss of information from information retention circuits in the circuit block. In the figures given in the example in reference 3, the voltage differential of the power supplied to the circuit block while the power switch is off is 0.7 or more volts and is the threshold voltage (PMOS is −0.14 volts and NMOS is 0.31 volts) of the MOS transistor comprising the circuit block.

SUMMARY OF THE INVENTION

The power switch is composed of MOS transistors having a threshold voltage of a sufficiently high absolute value. In the method of reference 2, the power switch is repeatedly turned on and off while the chip is in a standby (idle) state, and the node within the circuit block are repeatedly discharged. Large-size MOS transistors are generally used in the power switch to prevent a loss in speed from occurring during the circuit block operation. The parasitic capacitance of all nodes of the circuit block is also dependent on the circuit scale (integration) and may at times exceed several nanofarads. The repeated turning of the power switch on and off as well as the repeated discharging of the node within the block circuit therefore increase the chip current consumption.

In the method of reference 3 on the other hand, the voltage (voltage differential between power and ground) supplied to the circuit block when the power switch is off is larger than the absolute value of the MOS transistor threshold voltage (PMOS is −0.14 volts and NMOS is 0.31 volts).

Noticing the fact that the information in the information retention circuit can still be retained even if the supply voltage when the power supply switch was off is made lower than absolute value of the MOS transistor threshold voltage, the inventors developed a structure capable of retaining information in the information retention circuit and reducing electrical power loss due to leakage (current).

To resolve the above mentioned problems with the related art, in a typical embodiment of the invention, a semiconductor integrated circuit device comprising a circuit block having a first MOS transistor, and a leakage current control circuit having a second MOS transistor and a current source; a source and drain circuit of the second MOS transistor is formed between the power supply line of the circuit block and voltage potential point where the operating voltage is supplied. This current source is connected to the power supply line, and in a first state the power supply line is driven to a first voltage by the second MOS transistor and, in a second state, the power supply line is controlled at a second voltage by current flow in the current source. The voltage applied across the source and drain of the first MOS transistor in the second state is smaller than the voltage applied across the source and drain of the first MOS transistor in the first state.

The present invention is therefore capable of reducing the different types of leakage current (subthreshold leakage current, GIDL current, gate tunneling current, etc.) while the circuit block is in standby state while still maintaining the information stored in the information retention circuits within the circuit block. The present invention also allows high speed circuit block operation while the circuit block is in the operation state.

Figure 1:
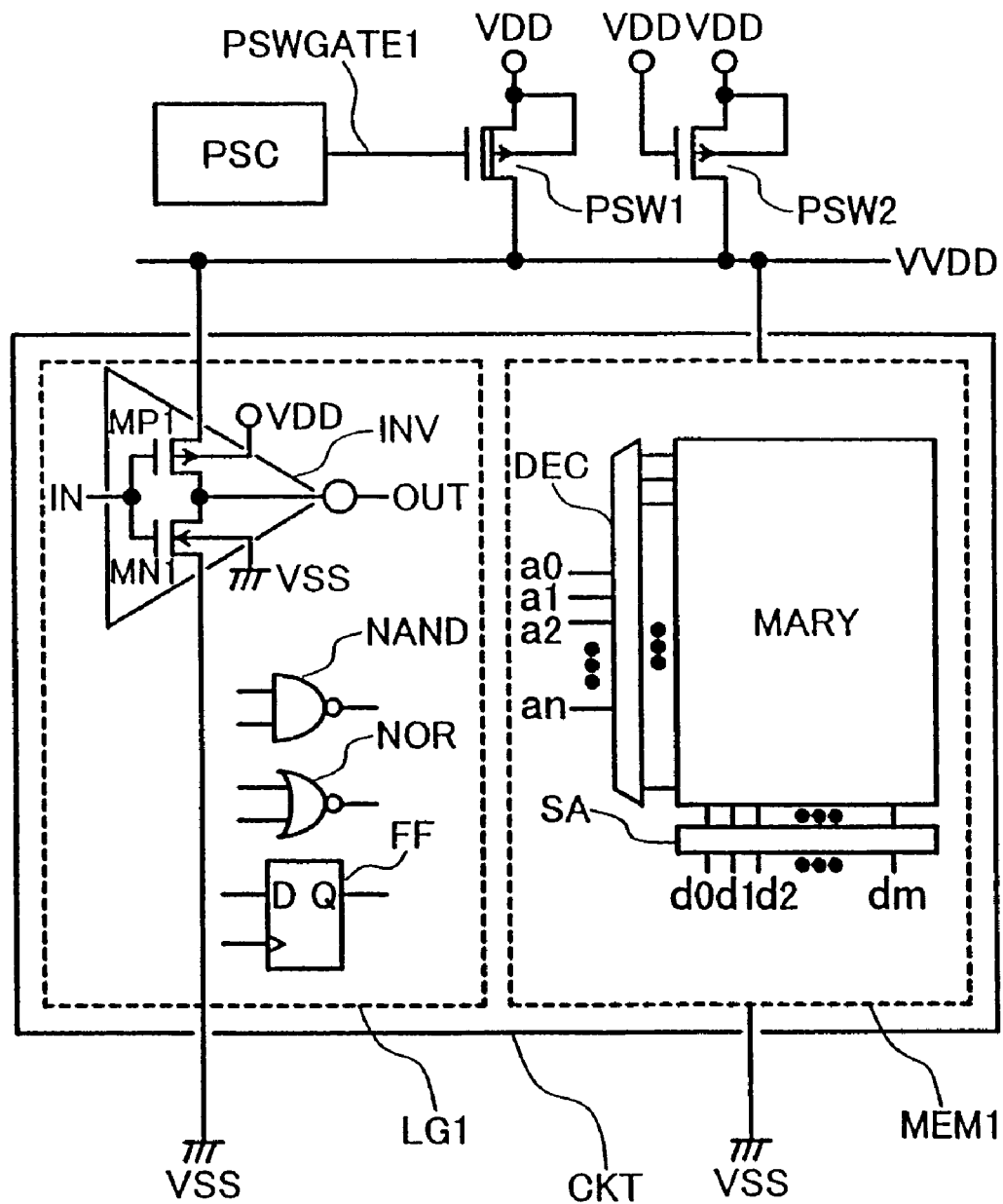
FIG. 1 is a block diagram showing the basic structure of the embodiment of the present invention.

The embodiments of the present invention are hereafter described while referring to the drawings.

DETAILED DESCRIPTION OF THE PREFERRED EMBODIMENTS

First Embodiment

FIG. 1 is a circuit diagram showing the basic structure of the invention. In the figure, CKT denotes the circuit block, PSW1 denotes the power switch, VDD denotes a power supply voltage for example with a voltage of 1.0 volts, VVDD denotes the virtual power line, VSS denotes the ground with a voltage of 0 volts, and PSC denotes the power switch controller. A circuit block CKT as shown for example in FIG. 1 contains a logic circuit LG1 composed of an inverter INV, a NAND circuit NAND, a NOR circuit NOR and a flip-flop circuit FF; and a memory MEM1 composed of a memory cell array MARY, word decoder DEC and sensing amplifier SA, etc. The circuit block CKT may also be comprised only of a logic circuit LG1 or a memory MEM1. One characteristic feature is it (circuit block) contains information retention circuits such as the flip-flop FF of the logic circuit LG1 and the memory cell array MARY. Here, the information retention circuits are circuits with volatile information retention functions and that information is determined by the CMOS logic.

The power switch controller PSC controls the on and off operation of the power switch PSW1 connected between the power supply VDD and the virtual power line VVDD. The power switch controller PSC also controls the current flow in the power supply VDD and the virtual power line VVDD. A current source is also connected between the power supply VDD and the virtual power line VVDD, and limits the current flowing to the virtual power line VVDD from the power supply VDD. The circuit block CKT is connected between the virtual power line VVDD and the ground VSS and the virtual power line VVDD is equivalent to an actual power line in the circuit block CKT. In other words, the current supplied to the circuit block during operation is mainly supplied from the power switch PSW1; and the current supplied to the circuit block during standby operation is mainly supplied to the current source PSW2. Though not shown in FIG. 1, the voltage of the power supply VDD is the circuit block CKT operating voltage and is supplied from a stable power supply circuit.

Figure 2:
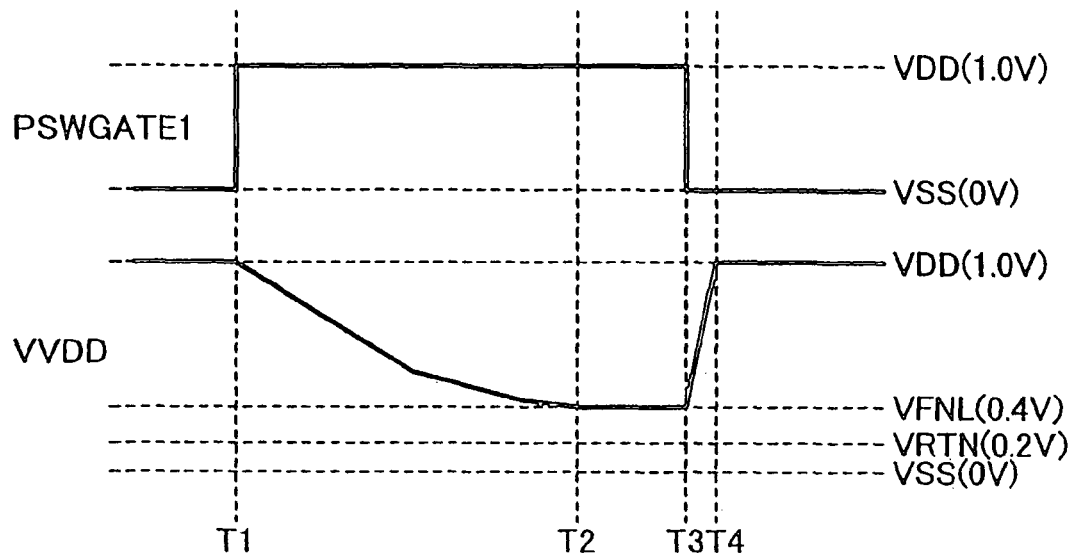
FIG. 2 is a timing chart for the operation example in FIG. 1.

The operation of FIG. 1 is shown next utilizing the timing chart of FIG. 2. Prior to time T1, the gate signal PSWGATE1 of power switch PSW1 is driven to low level by the power switch controller PSC and the power switch PSW1 turns on. In this state, power is supplied to the circuit block CKT by way of the power switch PSW1 so that the virtual power line VVDD reaches VDD potential and the circuit block CKT is operable (in operating state). At time T1, the gate signal PSWGATE1 of power switch PSW1 is driven to high level by the power switch controller PSC and the power switch PSW1 turns off. The voltage (or voltage potential) of virtual power line VVDD gradually discharges due to the current leakage from virtual power line VVDD of circuit block CKT to ground VSS by the power switch PSW1 turning off. As the voltage of the virtual power line VVDD becomes lower, Ioff (CKT) (The leakage current flowing to circuit block CKT is listed as Ioff(CKT) that was initially large (at time T1) also gradually becomes a smaller value (period from time T1 to T2). The virtual power line VVDD reaches the final converging stable voltage level VFNL (period from time T2 to T3).

This voltage level (VFNL) attained here is determined under the condition that: a leakage current (Ioff(CKT)) flowing from the virtual power line VVDD of circuit block CKT to ground VSS is equal to a power switch PSW1 off current (Ioff(PSW1)) flowing to the virtual power line VVDD added to a current I(PSW2) to a virtual power line VVDD by way of current source PSW2 from power supply VDD.

Though there are no particular restrictions, for the purposes of simplicity, the condition Ioff(PSW1)<<I(PSW2) is set. The absolute value of the threshold voltage of the PMOS transistor comprising the power switch PSW1 may for example be set larger than the absolute value of the threshold voltage of the PMOS transistor comprising the current source PSW2. In this case, the condition for virtual power line VVDD reaching the appropriate level is (Ioff(CKT)=I (PSW2). The current source PSW2 is utilized in this way to prevent an excessive voltage drop in virtual power line VVDD. Therefore, even if the initial (time T1) Ioff (CKT) is large, the voltage (potential) of virtual power line VVDD eventually drops to equal I(PSW2) and automatically reaches a stable point, and the value of Ioff (CKT) at that time is limited by the value of I(PSW2). In other words, the current source PSW2 functions as a leak current limiter circuit for circuit block CKT.

Figure 41:
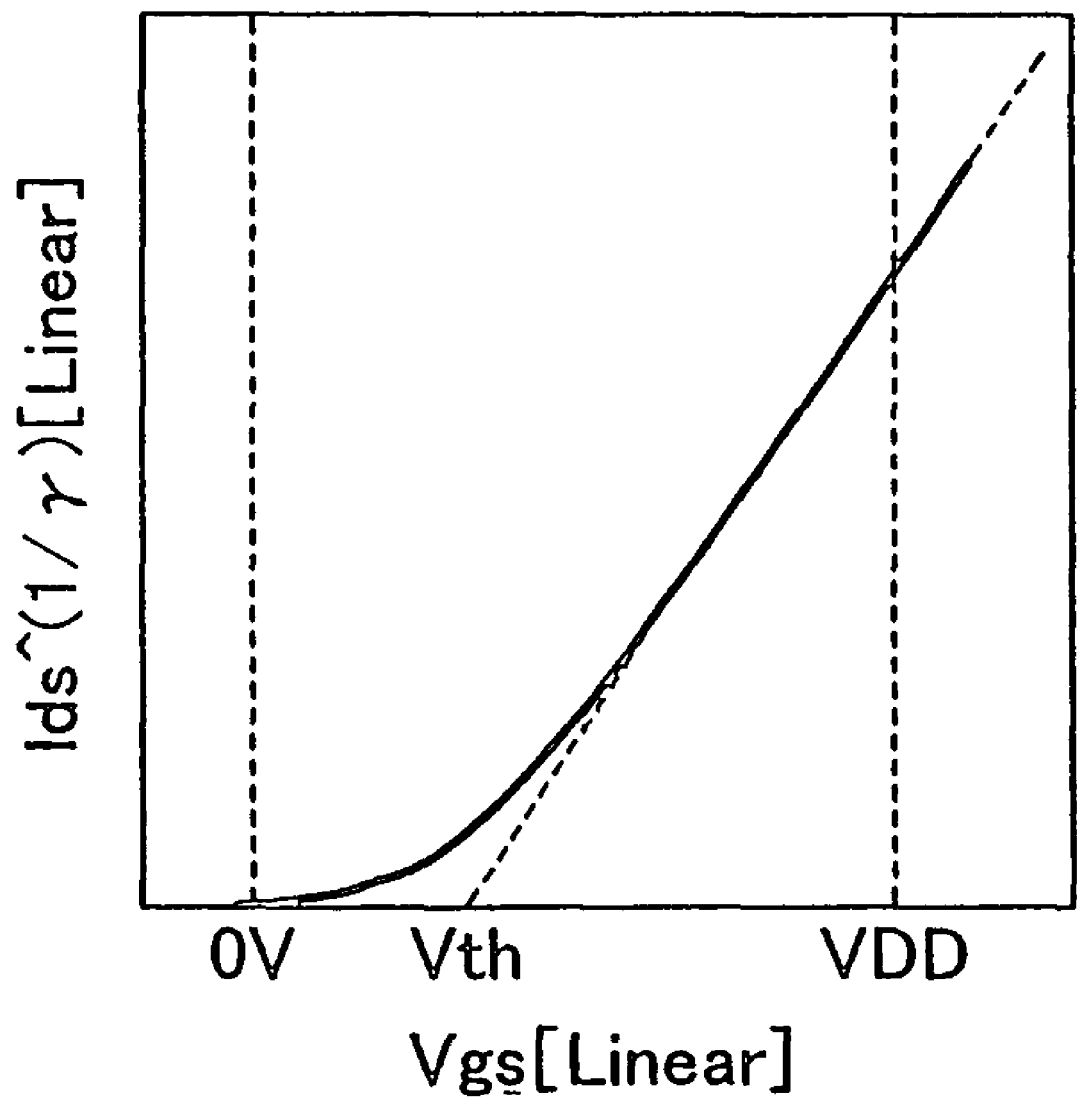
FIG. 41 is a graph defining the threshold voltage Vth of the MOS transistor.

In these specifications, the MOS transistor threshold voltage Vth is the gate voltage when the MOS transistor drain current (This current does not include the subthreshold leak current.) starts to flow. This Vth is determined by the following widely used definitions. In a saturation region where the gate voltage Vgs is sufficiently large and the drain voltage Vds is also sufficiently large, the drain current Ids is proportional to the y power of (Vgs-Vth). The 1/y power of drain current Ids therefore forms a straight line at a sufficiently large gate voltage Vgs as shown in FIG. 41. Therefore, the threshold voltage Vth can be found from a tangent of the direct line portion of the 1/y power of (Vgs-Vth) set as shown in FIG. 41. The value of y is greatly dependent on the gate length of the MOS transistor. In a long-channel MOS transistor having a gate length Lg of approximately 1 um, the value of y is approximately 2. In a short-channel MOS transistor with a gate length Lg below 0.25 μm, the value of y is smaller than 2 and is for example a value of approximately 1.4.

In the present invention, the size of the respective leakage currents such as the gate tunneling current and subthreshold leakage current during standby in the circuit block are determined by the current source PSW2. That value is smaller than the leakage current flowing in the circuit block CKT during operation. The process for that effect is described in detail next.

Generally, the smaller the voltage of the virtual power line VVDD, the smaller the value Ioff(CKT) becomes. The reason is described utilizing the leakage current flowing to the inverter INV within the circuit block CKT as an example.

(1) The source voltage of the PMOS transistor MP1 becomes a small voltage due to the virtual power line VVDD voltage becoming small. The substrate potential (voltage) of PMOS transistor MP1 is connected to power supply VDD and is a fixed voltage. A reverse bias (voltage) is therefore applied to the substrate and the PMOS transistor MP1 threshold voltage rises due to the back bias effect. The subthreshold leakage current flow across the source-drain of PMOS transistor MP1 is in this way reduced.

(2) The voltage across the source-drain of the PMOS transistor and NMOS transistor becomes smaller due to the small virtual power line VVDD voltage. The PMOS transistor and NMOS transistor threshold voltage in this way rises due to the DIBL (Drain Induced Barrier Lowering) effect. The subthreshold leakage current flow across the source-drain of the PMOS transistor and the NMOS transistor is in this way reduced. This DIBL (Drain Induced Barrier Lowering) effect can be made to show an even greater effect by back-biasing across the substrate-source as described in (1).

(3) The voltage across the source-drain of the PMOS transistor and NMOS transistor becomes smaller due to the small virtual power line VVDD voltage. This small voltage acts to reduce the gate tunneling current flowing in the gate dielectric (insulating film). The GIDL (Gate Induced Drain Leakage) current flowing to the substrate from the source or the drain is also reduced.

Figure 3:
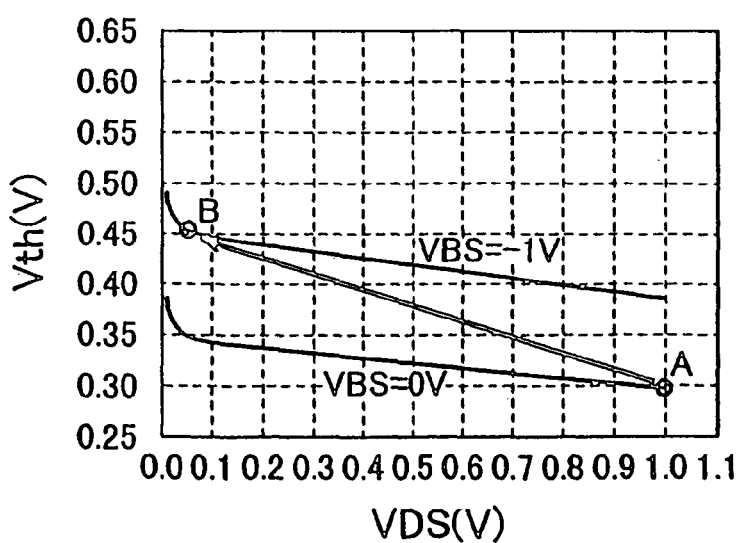
FIG. 3 is a graph showing the dependency of the drain-source voltage on the MOS transistor threshold voltage.

The measurement example in FIG. 3 shows the leak reduction effect achieved by the present invention. The figure shows actual measured values for the drain-source voltage VDS dependency on the NMOS transistor threshold voltage. The manufacturing process is for 0.13 μm CMOS (gate oxidation film is 1.9 nm) and the measured temperatures were room temperature. The voltage across the source-substrate VBS was utilized as the parameter. By utilizing VBS as the reverse bias and by reducing VDS, the threshold voltage was raised approximately 0.15 volts. This signifies that when the subthreshold slope coefficient S is set to 75 mV/dec, the leakage current flowing across the drain-source can be reduced approximately two digits.

Figure 4:
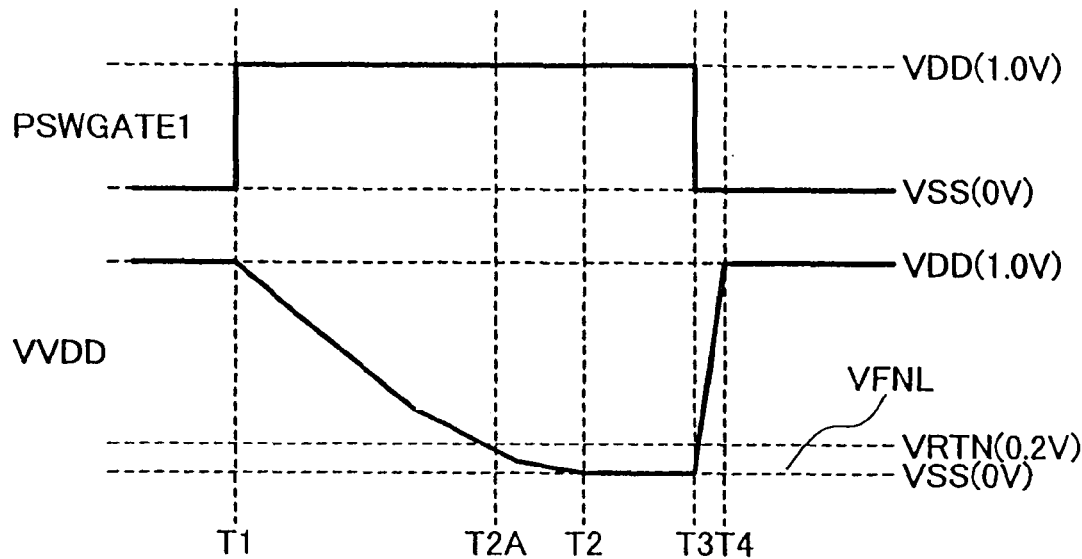
FIG. 4 is a timing chart when the virtual power line has completely discharged.

As shown in FIG. 2 in the present invention, in order to retain information stored within the information holding circuit within the circuit block CKT, the voltage value VFNL of the virtual power line VVDD can be a voltage higher than voltage VRTN which is the minimum voltage capable of retaining information stored within the information holding circuit. In the figures given in the example of FIG. 2, VDD is 1.0 volt, VFNL is 0.4 volts, and VRTN is 0.2 volts. In reference 2 there is no component equivalent to current source PSW2 so power to the circuit block is completely cut off during standby and until Ioff(CKT)=Ioff(PSW1)=0, the virtual power line VVDD discharges and reaches 0 volts. Therefore, as shown in FIG. 4, VFNL equals 0 which is less than VRTN, and information stored in the information storage circuits cannot be retained. In reference 3 on the other hand, the power supply voltage during standby is a value larger than the absolute value of threshold voltage of the MOS transistor comprising the circuit block CKT. This is assumed to be due to the general principle that the already on MOS transistor, shuts off during standby when the power supply voltage is made smaller than the MOS transistor threshold voltage and the status (information) held in the logic gates is then lost. However, in a CMOS logic circuit, making the power supply voltage smaller than the MOS transistor threshold voltage does not mean that information in the logic circuits is lost. The inventors noticed the fact that in a CMOS logic circuit with a first conductive MOS transistor and a second conductive MOS transistor connected in series, whether or not the logic circuit information can be maintained (held) depends on the on/off ratio of current flow in the first conducting MOS transistor in an on-state, and current flow in the second conducting MOS transistor in an off-state.

Figure 5:
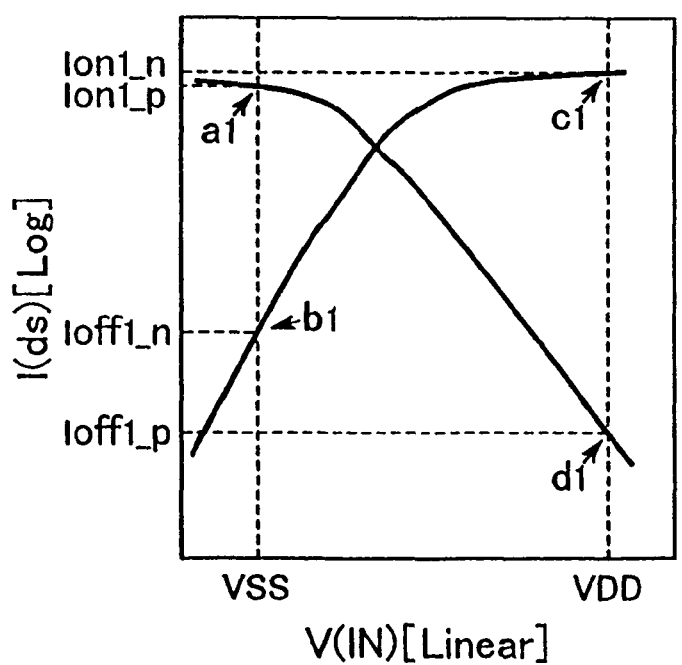
FIG. 5 is a timing chart showing characteristics during inverter operation.

The mechanism for reducing leakage current and the mechanism for maintaining information in the information retention circuits are described using the inverter INV within the circuit block CKT as a typical example of a CMOS logic circuit. Characteristics of the inverter INV during operation are shown in FIG. 5. The horizontal axis is the inverter input voltage and equivalent to the PMOS transistor MP1 and NMOS transistor MN1 gate signal voltage. The vertical axis is a logarithmic display of the drain current value I(ds) during gate operation. When the input to the inverter INV is at a high level (voltage is power supply VDD), the PMOS transistor MP1 is in the off state, reaching point d1 on the (device) characteristic graph and the MP1 drain current is the Ioff1_p flow only. The NMOS transistor MN1 is in the on state, point c1 on the characteristic graph is reached and only the Ion1_n of the MN1 drain current flows. On the other hand, when the inverter input is at low level (voltage is at ground potential VSS), the PMOS transistor MP1 is in the on state, point a1 on the characteristic graph is reached and only the Ion1_p drain current of MP1 flows. When the NMOS transistor MN1 is in the off state, the point b1 on the characteristic graph is reached and only the Ioff1_n drain current of MN1 flows. It can therefore be seen that an ON/OFF ratio for Ion1_n/Ioff1_p can be obtained when the inverter input is at high level; and further that an ON/OFF ratio for Ion1_p/Ioff1_n can be obtained when the inverter input is at low level. In either case, it can be seen that an ample ON/OFF ratio of 1 or more can be obtained. In regards to leakage current it can also be seen that an Ioff1_n current flows when the inverter input is at high level; and that an Ioff1_p current flows when the inverter input is at low level.

Figure 6:
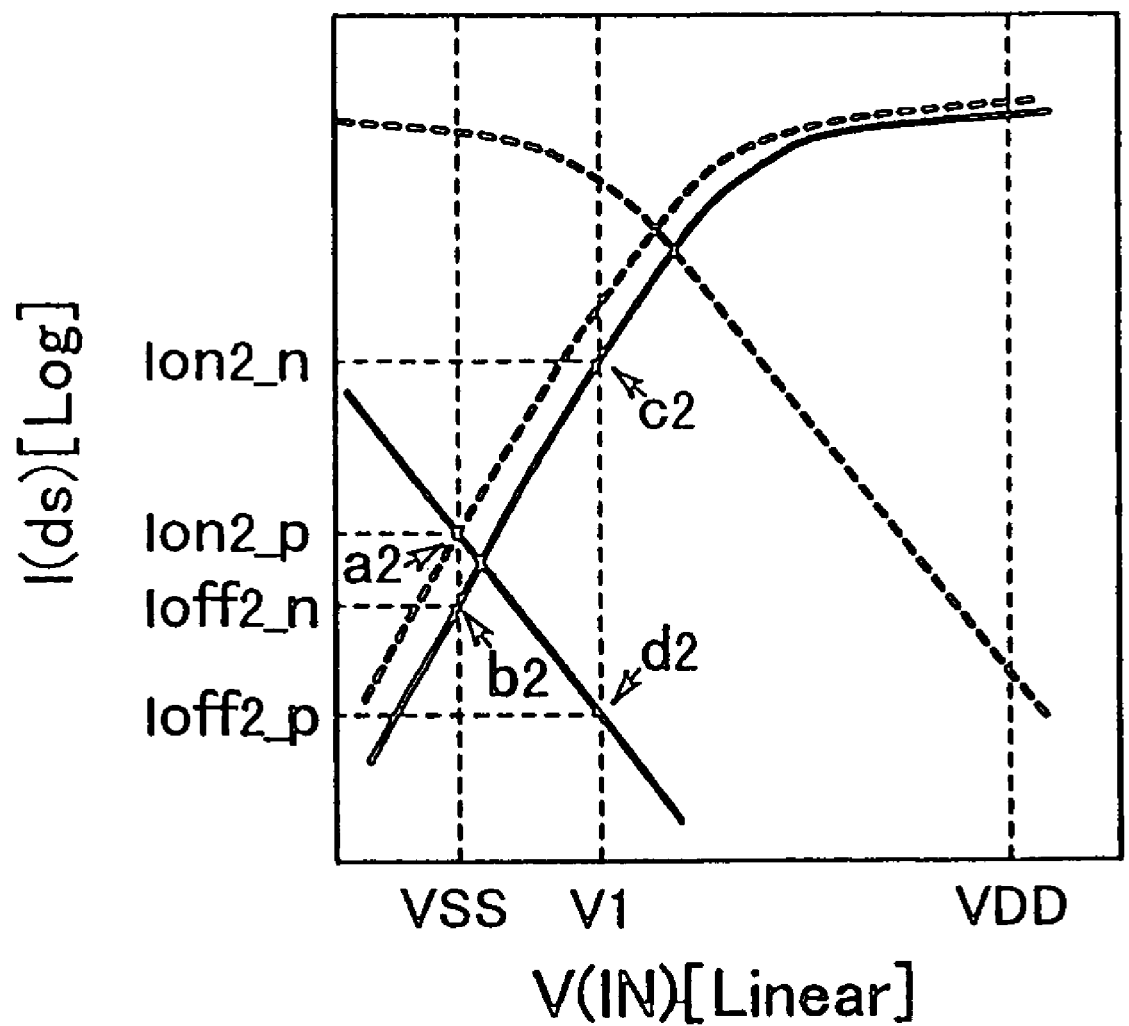
FIG. 6 is a timing chart showing characteristics during inverter standby (idle).

FIG. 6 is a graph showing inverter INV characteristics when the circuit block CKT voltage (potential) of the virtual power line VVDD has discharged to V1 during standby. The voltage V1 as shown in FIG. 6 is made to be smaller than the absolute value of the MOS transistor threshold voltage during usual operation. However in this case also, it can be seen that an ON/OFF ratio of Ion2_n/Ioff2_p is obtained when the inverter input is at high level; and that an ON/OFF ratio of Ion2_p/Ioff2_n is obtained when the inverter input is at low level. In either case, it can be seen that an ample ON/OFF ratio of 1 or more can be obtained. Accordingly, one can observe that an information storage circuit for storing information in a CMOS logic circuit can successfully retain the internally accumulated information. Therefore the correct logic status (information) can be maintained in the logic circuit. No special circuit is needed for maintaining the logic status (information). In regards to leakage current it can further be seen that an Ioff2_n current flows when the inverter input is at low level; and that an Ioff2_p current flows when the inverter input is at high level. The above described effects (back bias effect, DIBL effect, gate leakage reduction effect, (GIDL current reduction effect) cause a state of Ioff_2n<Ioff_1n, Ioff2_p<Ioff1_p. Compared to FIG. 5, the inverter leakage current has become small in FIG. 6.

Taking special note of this MOS transistor ON/OFF ratio, an evaluation was made of whether the CMOS circuit can correctly maintain the logic status (information). In the case for example of an inverter, the on/off characteristics are generally bad even with an on/off ratio of 1 or more. In cases where absolute values for the inverter amplification rate are all at an input voltage level less than 1, there is no guarantee that the correct logic state can be maintained (held) in a multistage connection to the entire inverter. In these specifications, obtaining an ample on/off rate signifies a state where the logic state (information) can be correctly retained (held) in multistage CMOS circuits or circuits having a positive feedback loop such as memory cells in SRAM devices.

Next, the minimum voltage VRTN capable of maintaining information accumulated within an information holding circuit, for example an SRAM cell or flip-flop circuit FF within the circuit block CKT is evaluated.

Figure 7:
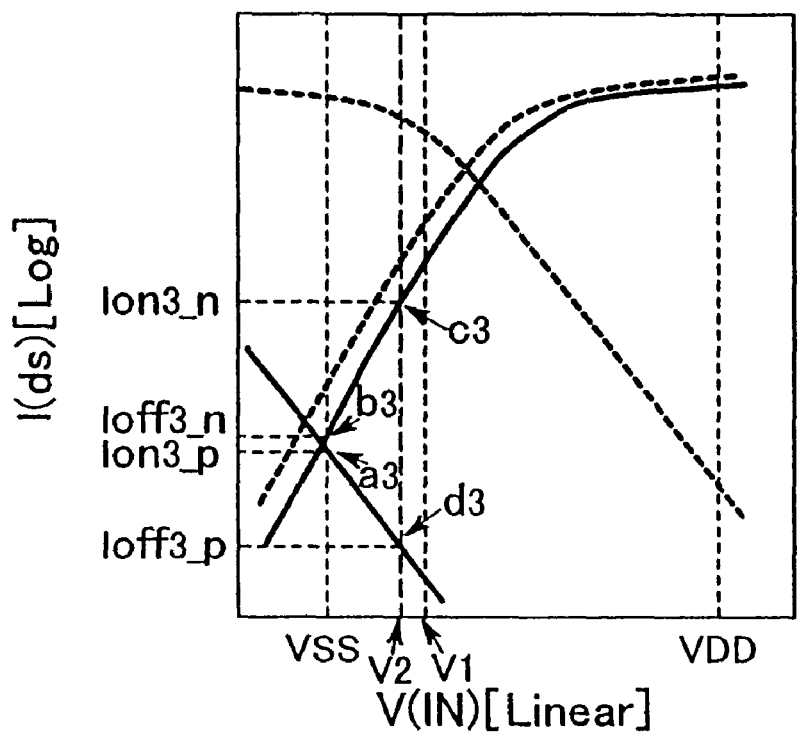
FIG. 7 is a timing chart showing characteristics during inverter standby (idle)

FIG. 7 is a graph of inverter characteristics when the voltage potential of the virtual power line VVDD in FIG. 6 discharges from a voltage V1 to an even lower voltage V2 with the circuit block CKT in standby. When the inverter input is at high level, the on/off ratio is Ion3_n/Ioff3_p and an ample on/off ratio of 1 or more is obtained. However, it can be seen that when the inverter input is at low level, the state is Ion3_p/Ioff3_n<1 and an ample on/off ratio is not obtained. If the inverter input is at low level at this time, the logic information in the inverter might become inverted.

Examining FIG. 6 and FIG. 7 shows that the standby voltage of the virtual power line VVDD can be established at a value from V1 to V2 in order to maintain the correct logic state (information) in the inverter INV. A minimum virtual power supply voltage for correct operation can be established in the same way even in a fully CMOS status RAM (SRAM) having for example six transistors. The term, correct operation as used here signifies the capability to retain (hold) information within the information holding circuit. No AC type operation is needed to achieve this correct operation so there is little need for special caution with SRAM static noise machines (SNM). When reducing the VRTN lower voltage limit some deterioration in immunity to soft errors may occur. However effective measures may be taken such as increasing the capacity of the memory mode of the information storage circuit or adding an error correction circuit such as an ECC.

In the present invention, the voltage for maintaining (holding) the DC state (logic state) during standby in the circuit within the circuit block CKT is determined by the (minimum voltage) VRTN. Unlike the figures given in the example for reference 3, there is no need to make this value larger than the absolute value of threshold voltage of the MOS transistor. The present invention has shown that information can be maintained within the information holding circuit during standby, even if a voltage smaller than the absolute threshold voltage of the MOS transistor is used. Further, in reference 3, a voltage equivalent to the VFNL was set by a clamping voltage on the diode. However, the structure in FIG. 1, this value is automatically set by matching Ioff(CKT) and I(PSW2). This point is described in detail later.

In the example in FIG. 1, when applying a substrate voltage to the substrate terminal of the MOS transistor, the power supply VDD is the PMOS transistor and the ground is the NMOS transistor. These specifications assume the connections in FIG. 1 for the substrate voltage potential. However there are no particular limitations on the voltage potential. The connection shown in FIG. 1 has the advantage that a large capacitance is not required for driving the substrate. However, the substrate can also be driven as needed according to methods described later on. Needless to say however, the leakage current reduction effect may change when the connections differ from FIG. 1. A modified example for enhancing the leakage current reduction effect by lowering the MOS transistor substrate voltage potential is described.

Figure 8:
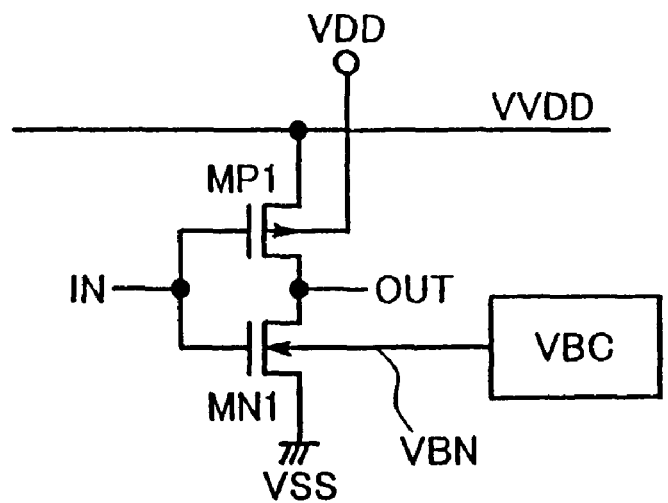
FIG. 8 is a circuit diagram showing the structure for controlling the substrate bias potential of the circuit block.

In the present invention, the minimum voltage VFNL of the virtual power line voltage potential is a value larger than the voltage VRTN. Also, the smaller the VFNL becomes, the larger the leakage current reduction effect in the circuit block CKT during standby. Therefore, if the voltage VRTN can be made a small value, then the VFNL can be reduced by that amount and the circuit block CKT leakage current can be reduced. FIG. 8 is a modified example for achieving a VRTN value smaller than the embodiment in FIG. 1.

Figure 9:
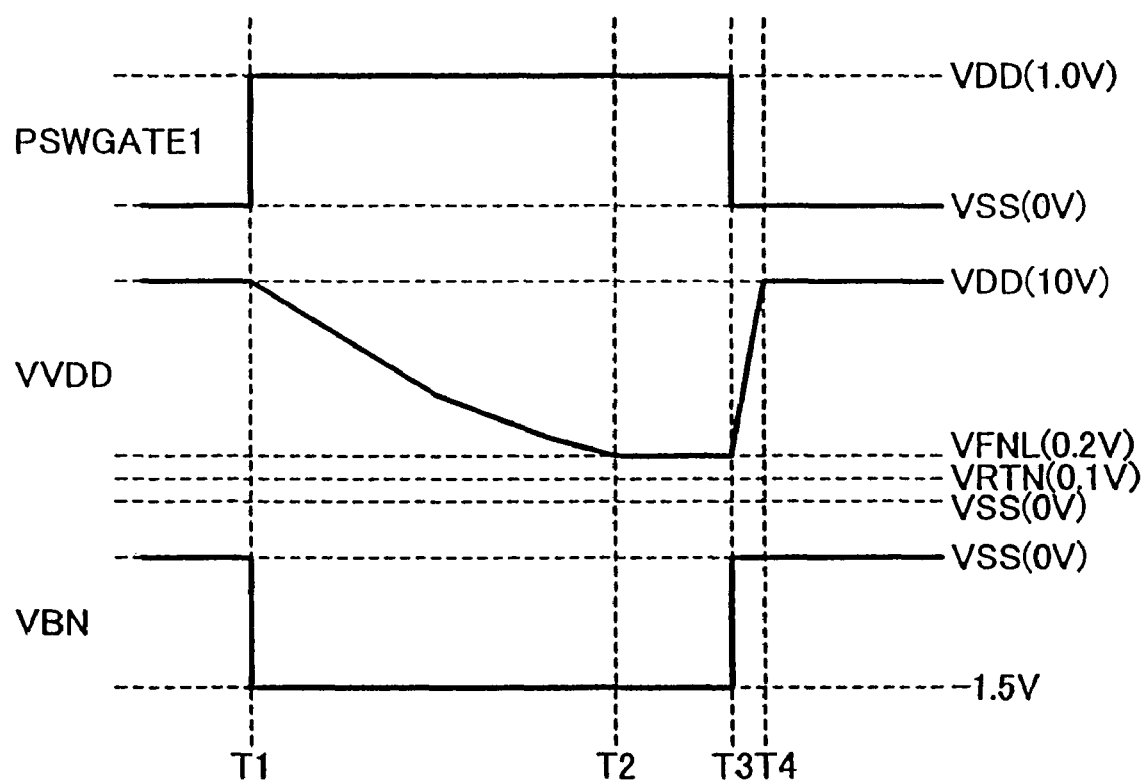
FIG. 9 is a timing chart for the operation example in FIG. 8.
Figure 10:
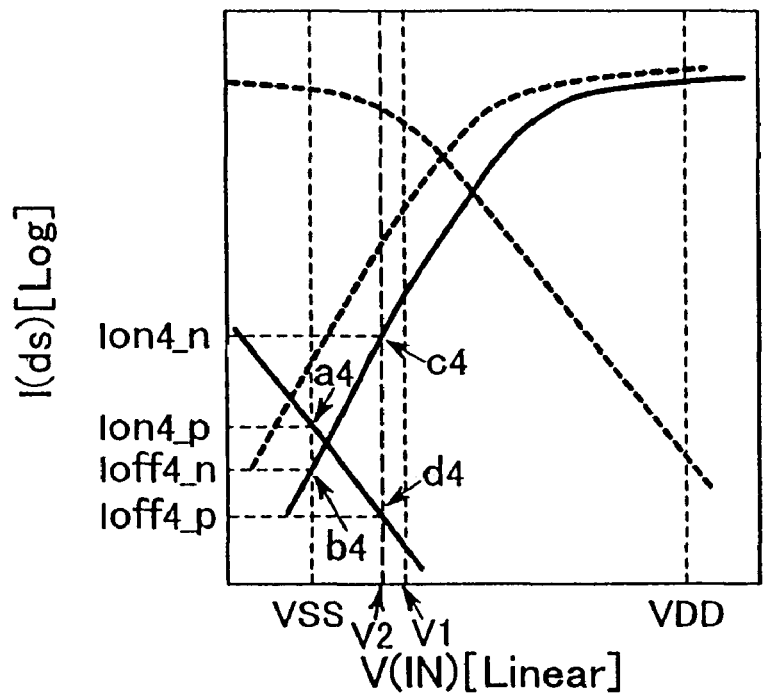
FIG. 10 is a graph showing characteristics of the structure in FIG. 8 when the inverter is in standby (idle)

Examining FIG. 7 shows that the inability to maintain (keep) the logic state (information) by Ion3_p/Ioff3_n<1 during standby is caused by a drop in NMOS transistor MN1 off current (Ioff3_n). This drop is small compared to the drop in PMOS transistor MP1 on current (Ion3_p) during discharge of the virtual power line VVDD in standby. Therefore in the embodiment of FIG. 8 the substrate voltage of NMOS transistor MN1 is controlled during standby and the threshold voltage of the NMOS transistor raised. In this way, even a low virtual power line VVDD voltage can satisfy Ion3_p/Ioff3_n>1. Here, VBC is the substrate bias control circuit and VBN is the substrate bias signal for the NMOS transistor. A timing chart for controlling the substrate voltage potential is shown in FIG. 9. Applying a −1.5 volts as the substrate bias signal VBN during standby (period from time T1 to T3) controls the NMOS transistor MN1 off current (Ioff3_n). FIG. 10 is a graph showing the characteristics of the inverter in FIG. 8. Here, raising the NMOS transistor threshold, moves the NMOS transistor curve farther downward during standby than in the case of FIG. 7. In this way, even if the voltage of the virtual power line VVDD discharges down to voltage V2 during standby the same as in FIG. 7, the on/off ratio (Ion4_p/Ioff4/n) will be a value sufficiently larger than 1 or more when the inverter input is at low level.

Figure 11:
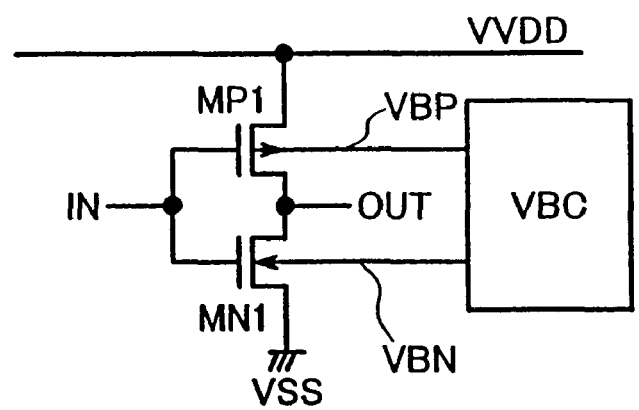
FIG. 11 is a circuit diagram showing another structure for controlling the substrate bias potential of the circuit block.

If the MOS transistor characteristics within the circuit block CKT are satisfactorily controlled in this way during standby, then a smaller VRTN value can be obtained compared to when there is no control (of transistor characteristics). FIG. 8 shows an effective method for controlling the transistor characteristics by controlling the substrate bias. FIG. 1 is a structure for controlling the substrate bias potential of the PMOS transistor and the NMOS transistor within the circuit block CKT. The threshold voltages of the PMOS transistor and NMOS transistor should preferably be adjusted for a balanced state to achieve normal circuit operation in order to apply a low voltage as the power to the circuit block during standby. In FIG. 11 the PMOS transistor substrate bias signal VBP is also controlled in addition to the structure in FIG. 8. Raising the PMOS transistor threshold voltage has the effect of raising the VRTN however a configuration capable of separately controlling the threshold voltages of the PMOS transistor and NMOS transistor is effective in order to lower the overall leakage current and to achieve balanced PMOS transistor and NMOS transistor threshold voltages.

Though there are no particular restrictions on the substrate bias signal VBP and VBN voltages during operation, a low voltage may be applied to VBP (for example, VDD or a lower voltage) and a high voltage may be applied to VBN (for example VSS or a higher voltage) to achieve high speed circuit block CKT operation. An optimal voltage may be applied to the substrate bias signal VBP, VBN according to the high speed operation needed in the circuit block CKT.

Typical inverter INV configurations (structures) within the circuit block CKT were shown in FIG. 8 and FIG. 11. These however showed nothing more than typical CMOS logic circuits and needless to say, can be applied to various circuits containing information retention circuits such as shown in the circuit block of FIG. 1. In substrate bias control in particular, if the substrate bias voltage value applied to the MOS transistor substrate is determined according to the process, temperature and power supply voltage, then irregularities in the process and fluctuations in the temperature and power supply voltage can be compensated and VRTN made a smaller value.

A specific structure for the current source PSW2 is described next.

The VFNL is established by conditions wherein the leakage current Ioff(CKT) flowing from virtual power line VVDD to ground VSS is equal to; the off current Ioff(PSW1) of power switch PSW1 flowing to virtual power line VVDD from power supply VDD plus the current I(PSW2) flowing to virtual power line VVDD by way of current source PSW2 from the power supply VDD. Setting the VFNL is simple if conditions where the current Ioff(PSW1)<<I(PSW2) can be established as described above. If these conditions can be established then the voltage of the virtual power line VVDD during standby then a value satisfying Ioff(CKT)=I(PSW2) during normal operation can be obtained. The condition Ioff(PSW1)<<I(PSW2) can be satisfied by selecting device parameters for the power switch PSW1 and the current source PSW2. The configuration (or structure) of FIG. 12 overdrives the power switch PSW1 gate signal up to VDD+α during standby as shown in FIG. 13. A reverse bias voltage is in this way applied across the source-drain of power switch PSW1 and the Ioff(PSW1) becomes small. This is one more method for achieving the Ioff(PSW1)<<I(PSW2) condition. A structure for the current source PSW2 to achieve the specified VFNL in FIG. 12 through FIG. 16 is described next.

Figure 12:
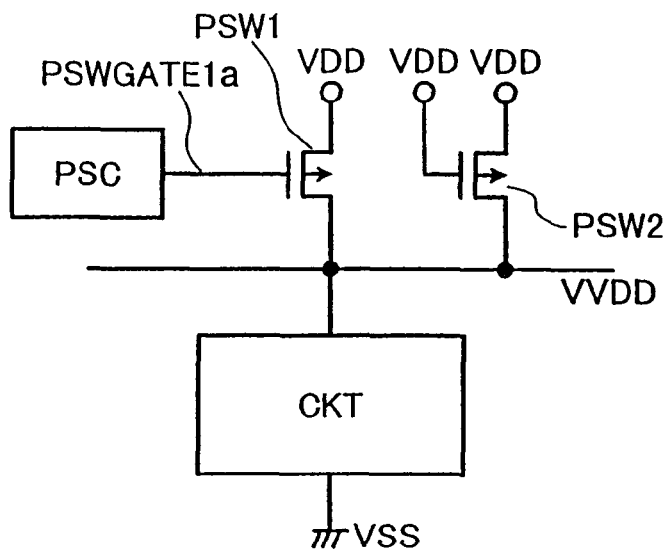
FIG. 12 is a drawing showing a structure utilizing a current source different from FIG. 1.
Figure 13:
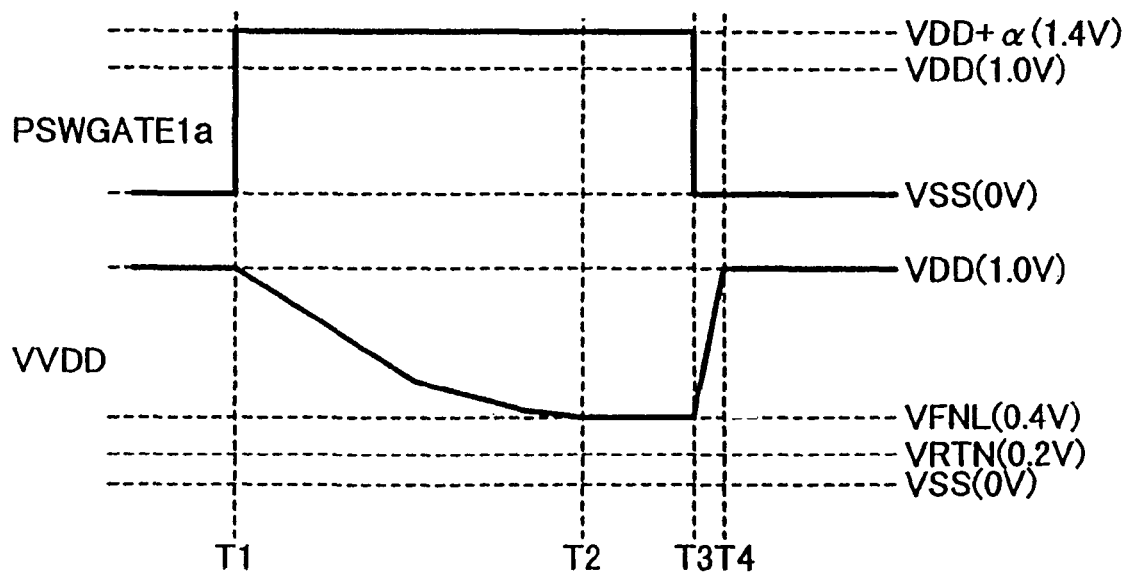
FIG. 13 is a timing chart for the operation example in FIG. 12.

In the structures in FIG. 1 and FIG. 12, I(PSW2) is determined by the off-current of PMOS transistor PSW2 in order to connect the gate signal of PMOS transistor PSW2 to power supply VDD. The Ioff(CKT) is also mainly determined by the off current of the MOS transistor. The main components of the MOS transistor drain-source current are diffusion current and drift current. The main component of the on-current is drift current and the main component of the off-current is diffusion current. These drift currents and diffusion currents are characterized in that the temperature characteristics change inversely according to these currents. In the I(PSW2) and Ioff(CKT), the MOS transistor off current is a main component, and the subthreshold leakage current is a main component so that fluctuations in characteristics tend to be the same for temperature and power supply voltage fluctuations and process irregularities. In other words, if I(PSW2) becomes large due to temperature fluctuations then the Ioff(CKT) will also become large. Also, if I(PSW2) becomes small then the Ioff(CKT) will also become small and serve to suppress fluctuations in the virtual power line VVDD to small fluctuations. This has the advantages that leakage current during standby is in this way determined only by the gate width W of one MOS transistor and that the design specifications for VFNL are easy to achieve.

Figure 14:
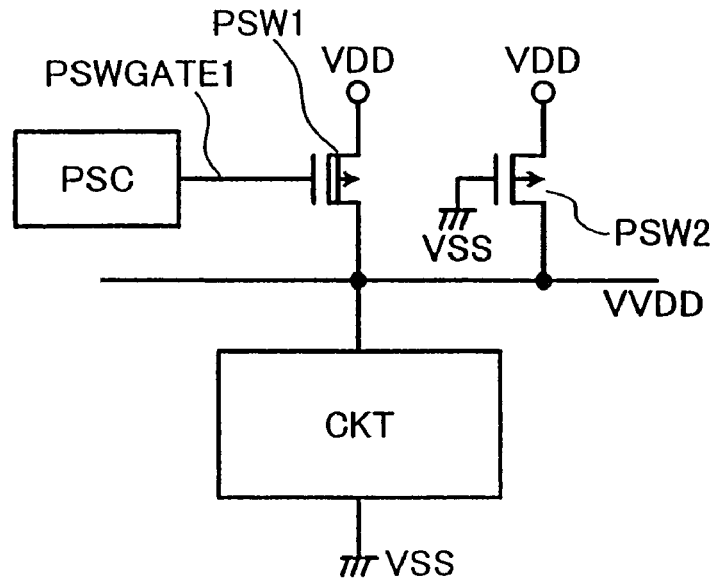
FIG. 14 is a drawing showing a structure utilizing a current source different from FIG. 1.

FIG. 14 is a configuration (or structure) used when the gate signal of the PMOS transistor comprising the current source PSW2 of FIG. 1 is connected to VSS (ground). In the structure of FIG. 14, the fluctuations in device characteristics such as the I(PSW2) and Ioff(CKT) temperatures and power supply VDD might be different since the Ioff(CKT) is mainly determined by the transistor off current. Therefore the necessity occurs for taking the above fluctuations in characteristics fully into account for a VNFL value determined by the balance of I(PSW2) and Ioff(CKT). However, the ability to establish the I(PSW2) value by the PMOS transistor PSW2 on current, in which the current consumption of the circuit block CKT during standby is determined by the PMOS transistor PSW2 on-current has the advantages of smaller temperature dependency and stable operating characteristics compared to finding that value by determining the PMOS transistor PSW2 off-current. Also, the current source PSW2 must provide just enough current to maintain the information in the information retention circuits within the circuit block CKT and this structure has the advantage that a small-sized current source PSW2 is capable of supplying this current as the transistor on-current.

Figure 15:
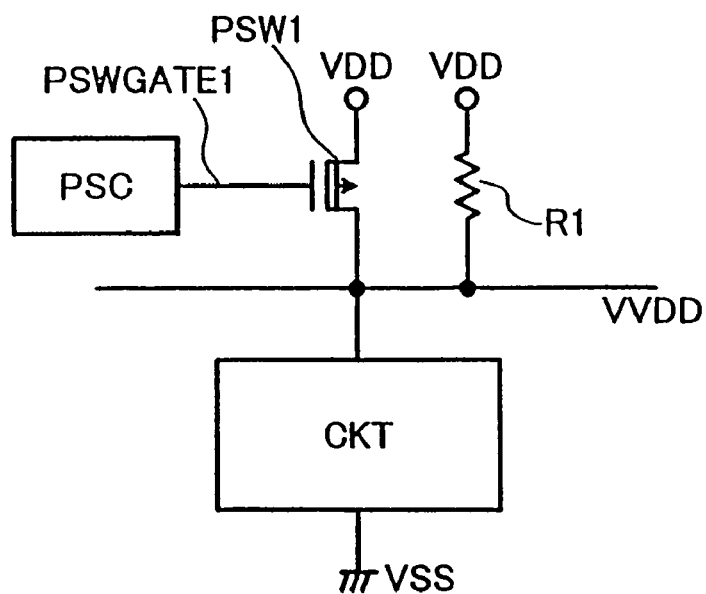
FIG. 15 is a structure using a resistor as the current source of FIG. 1.

In the structure in FIG. 15, the I(PSW2) is determined by the resistor R1. There are no particular restrictions on the method to achieve this resistance. A diffusion resistor, a well resistor or a gate wiring resistor may be used. Determining I(PSW2) by the resistance has the advantage the current source PSW2 will have small temperature dependency.

Figure 16:
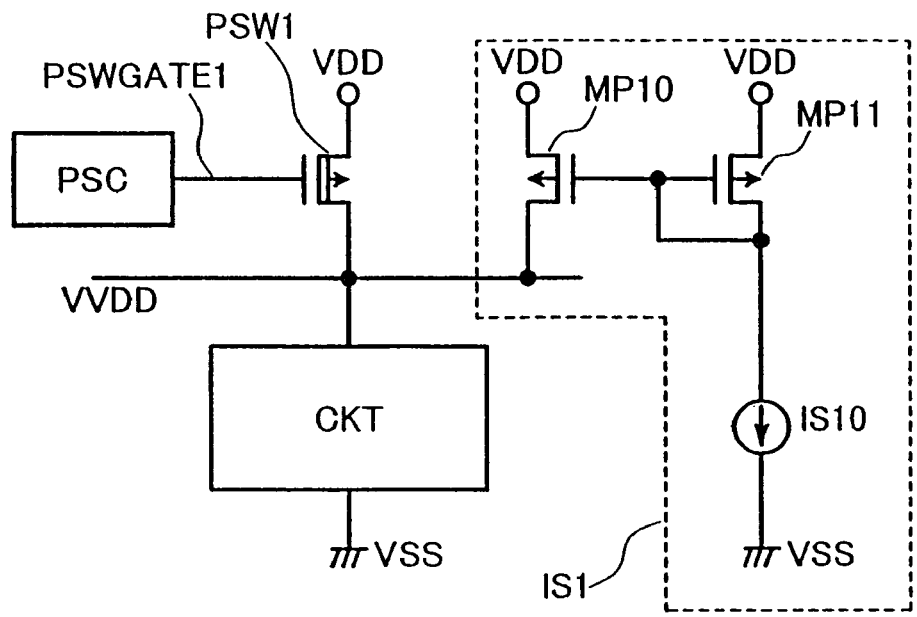
FIG. 16 is a diagram showing a structure using a constant current circuit as the current source of FIG. 1.

FIG. 16 is a structure for achieving I(PSW2) with a constant current circuit. A constant current circuit IS1 is composed of PMOS transistors MP10, MP11 and a constant current source IS10. Utilizing a constant current circuit to comprise I(PSW2) has the advantages that the current is determined by the constant current circuit and the leakage current value in the circuit block during standby is not dependent on the virtual power line VVDD or the scale of the circuit block CKT.

The various configurations of the current source PSW2 were described above. In the present invention, the power during operation was mainly supplied to the circuit block CKT by the power switch PSW1. During standby the power was mainly supplied to the circuit block CKT by the current source PSW2. During standby the VFNL is determined by the balance between Ioff(CKT) and the current of the current source PSW2 and it is crucial that the condition VFNL>VRTN be satisfied. The configuration (structure) of the current source is not limited to that described above. Therefore a structure may also be used that has no current source PSW2 and determines the VFNL by the balance of the off current Ioff(PSW1) of the power switch PSW1 during standby and the Ioff(CKT), and sets the size and threshold voltage of power switch PSW1 so that VFNL is greater than VRTN, or sets the thickness of the gate dielectric film (In these specifications, the gate dielectric is the gate dielectric thickness taking into account the conductance of the gate insulation (dielectric) material.) and gate signal amplitude, etc.

For example, during operation when the required current flow in power switch PSW1 is several amperes, and the leakage current of the circuit block CKT is set to several hundred microamperes during standby, the on/off ratio of power switch PSW1 may be four digits. When the on/off ratio required in power switch PSW1 is small, the leakage reduction method of the present invention can be achieved by a structure that eliminates the current source PSW2 from the structure of FIG. 1 and controls the power switch PSW1 in this way. A structure eliminating the current source PSW2 in this way has the advantage of small overhead. However installing a current source PSW2 has the advantage of rendering a large degree of freedom in design. For example, when a large on/off ratio is needed, a power switch PSW1 design may be evaluated to provide that on/off ratio. A further advantage is that there is no need to consider the balance adjustment needed between the Ioff(PSW1) and Ioff(CKT) during standby. Utilizing separate circuits for supply power to the circuit block CKT during operation from the power switch PSW1, and for supplying power to the circuit block CKT during standby makes the design of these leakage control circuits simple.

Figure 17:
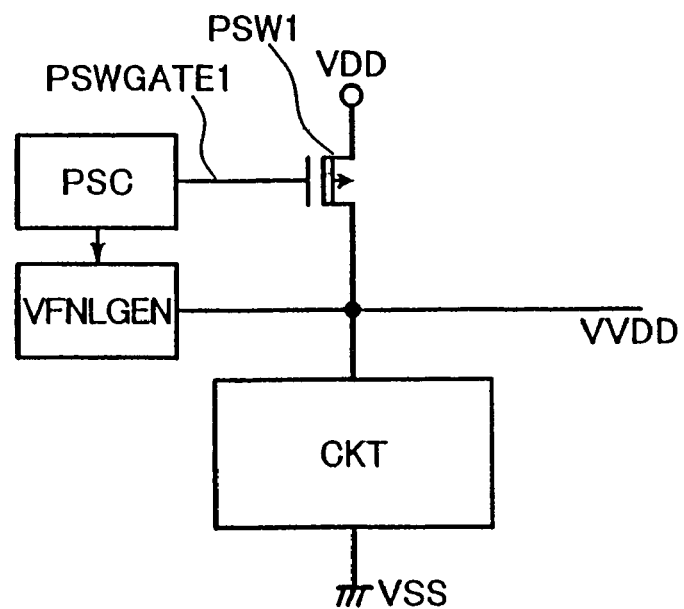
FIG. 17 is a diagram showing a structure using a voltage source instead of the current source of FIG. 1.

FIG. 17 is another example for setting the VFNL during standby. In FIG. 17, the voltage source VFNLGEN generates a VFNL of a specified voltage drop and drives the virtual power line VVDD. In the operating state, power is supplied to the circuit block by the power switch PSW1 and in standby state power is supplied to the circuit block by the voltage source VFNLGEN. During standby, the value of VFNL generated from the voltage source VFNLGEN may be a value of VRTN or more. Needless to say however, the lower the voltage, the smaller the value of leakage current that can be obtained from the circuit block CKT during standby. There are no particular restrictions on the configuration (structure) of the voltage source VFNLGEN. When the voltage source VFNLGEN is integrated onto the same chip holding the circuit block CKT, then a structure for generating a specific VFNL can be achieved for example by utilizing a voltage regulator of the known art with the power supply VDD. The voltage source VFNLGEN may also be installed outside of that chip. When directly generating VFNL from the voltage source VFNLGEN as shown in FIG. 17, a design can be achieved for making the voltage of the virtual power line VVDD close to that of VRTN. The output voltage VFNL of the voltage source VFNLGEN may also be automatically controlled according to the power supply VDD voltage, temperature and process conditions, etc.

The present invention is characterized in that power consumption due to leakage current in the circuit block during the standby state can be greatly reduced while still maintaining (keeping) the information within the information retention circuits within the circuit block. This standby function is here called the stand-by state with data retention. In addition to this stand-by state with data retention, the VFNL may be set to a smaller value (value of VRTN or lower) by reducing the current flowing in the current source PSW2 and reducing the voltage of the voltage source VFNLGEN (configuration in FIG. 17). The information in the information retention circuit within the circuit block will be lost in this structure, however a standby state (Called the deep stand-by state to distinguish it from the stand-by state with data retention. In these specifications, these terms are used to classify the two states.) having lower power consumption than in stand-by state with data retention can be achieved.

Figure 18:
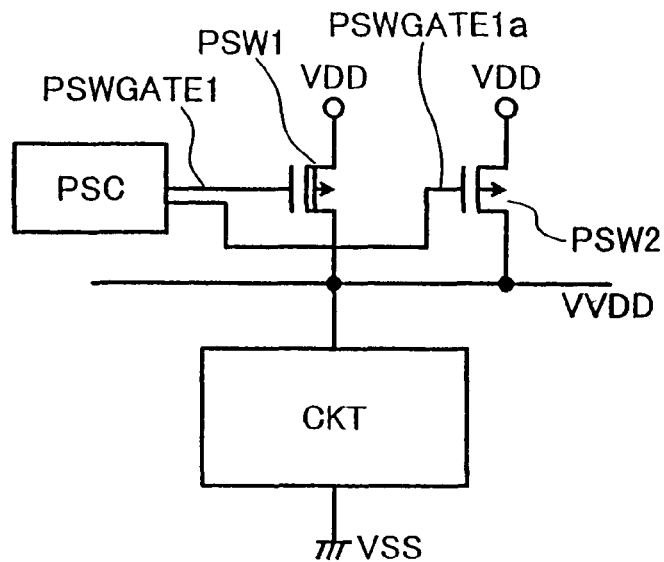
FIG. 18 is a diagram showing the structure for achieving the deep standby state.
Figure 19:
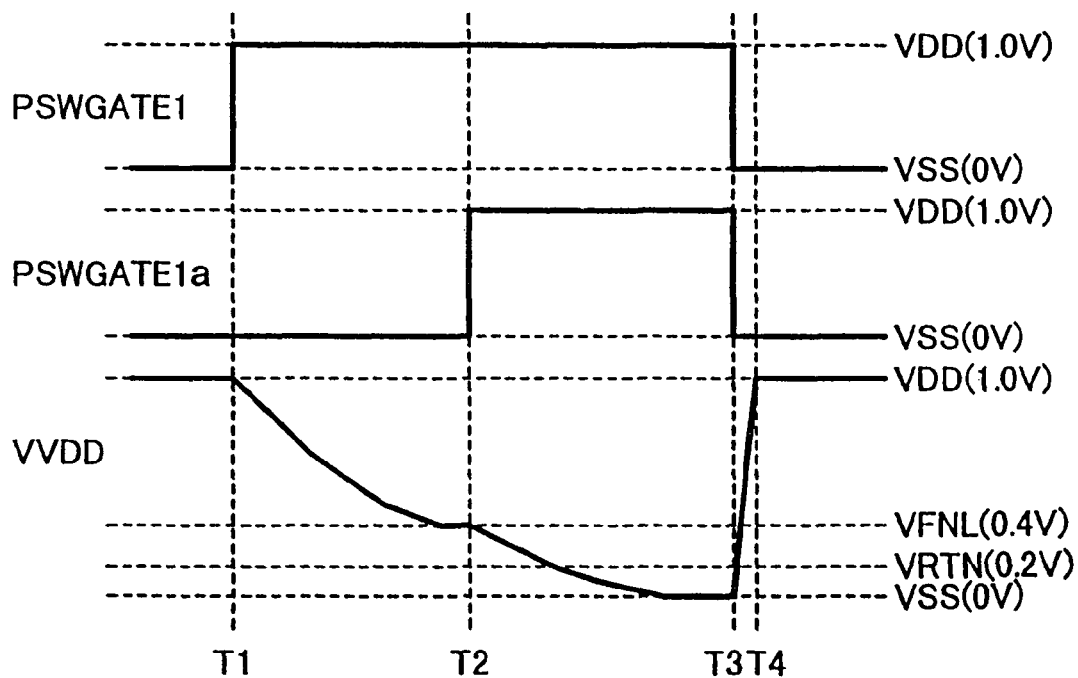
FIG. 19 is a timing chart for the operation in FIG. 18.

As one example, the structure of FIG. 18 shows an example for achieving the deep stand-by state of FIG. 14. In FIG. 18, the gate signal PSWGATE1a of the current source PSW2 is controlled by the power switch controller PSC. FIG. 19 is a timing chart showing an example of the operation in FIG. 18. In the stand-by state with data retention from time T1 to time T2, a low level is applied to the gate signal of current source PSW2 the same as the case of the structure in FIG. 14 by means of the power switch controller PSC. In the deep standby state from time T2 to time T3, a high level is applied to the gate signal of the current source PSW2 by the power switch controller PSC. In the deep stand-by state, I(PSW2) is determined by the on current of PMOS transistor PSW2 and the VFNL is determined by the interaction between this on-current and Ioff(CKT), and the condition VFNL>VRTN satisfied. However, since the PMOS transistor PSW2 is off from time T2 to time T3, the value of VFNL is nearly zero (of course, a value below VRTN). Though information cannot be held in the information retention circuits during deep standby state, the deep stand-by state has the advantage of lower leakage current than the stand-by state with data retention. If retention of information in the information retention circuits is not required, then power consumption can be reduced even further by changing to the deep stand-by state.

Figure 20:
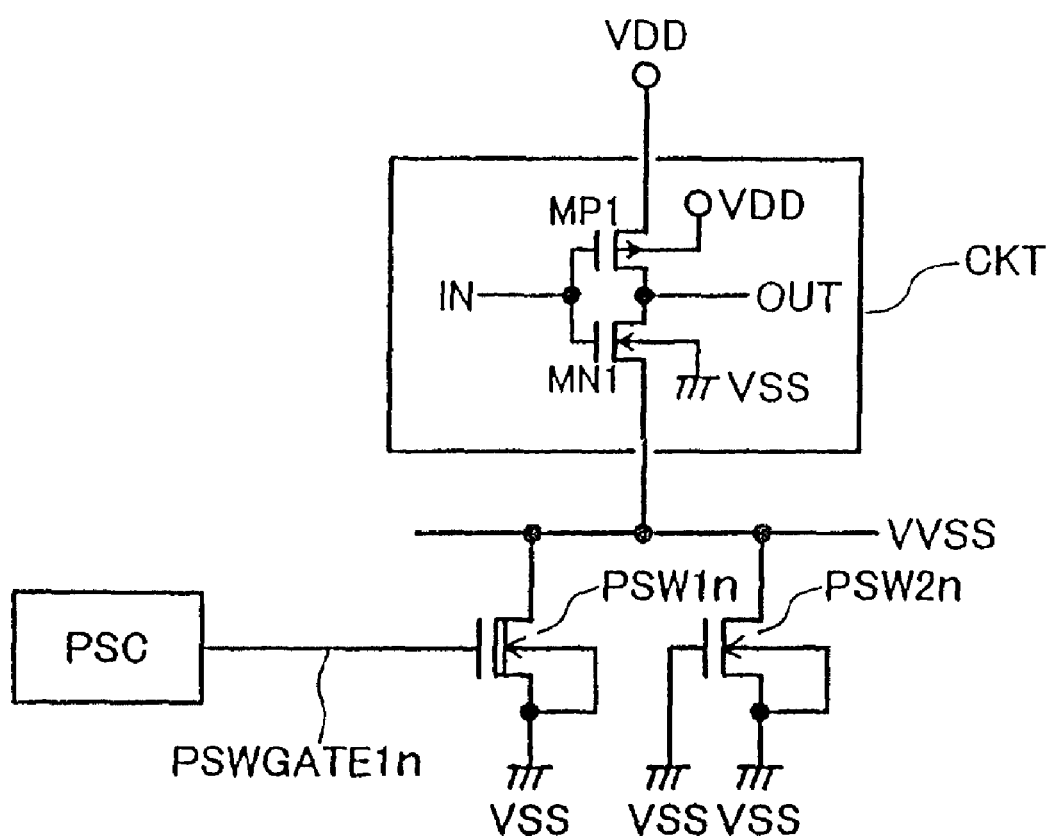
FIG. 20 is a diagram showing a structure utilizing an NMOS transistor as the power switch.
Figure 21:
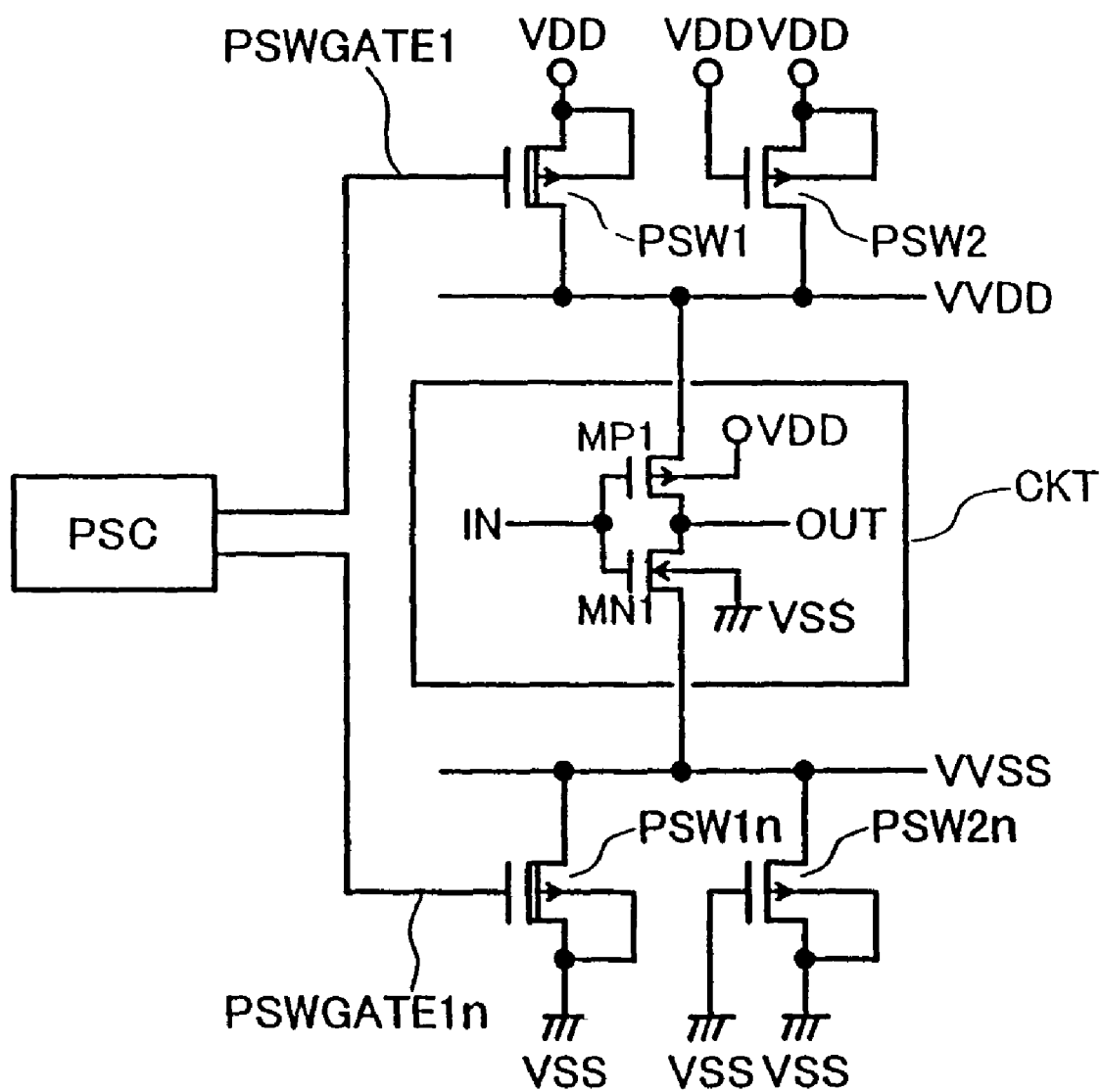
FIG. 21 is a diagram showing a structure when using both a PMOS transistor and NMOS transistor as the power switch.

The above structures utilized PMOS transistors in the power switch PSW1 and during the standby state controlled the current flow between power supply VDD and the virtual power line VVDD. However, as shown in FIG. 20, an NMOS transistor PSW1n may be utilized as the power switch and during standby may regulate the current flow between the virtual ground VVSS and the ground VSS. A configuration (structure) equivalent to the current source PSW2 of FIG. 1 is achieved by the NMOS transistor PSW2n in FIG. 20. The on-resistance of the power switch is small during operation but the impedance of the virtual power line VVDD or the virtual ground (line) VSS can be reduced so that a drop in speed of the circuit block CKT applicable to the present invention can be prevented. Generally, PMOS transistors have small on-resistance near the gate width compared to NMOS transistors. Accordingly, the structure of FIG. 20 can suppress the circuit block speed drop to a smaller amount than the structure of FIG. 1 during operation with the same surface area overhead. Further, a circuit block with an equivalent operating speed can be achieved with a smaller surface area overhead. FIG. 21 is a structure combining FIG. 1 and FIG. 20. Both the power switch PSW2 and the current source PSW2n are installed in the structure of FIG. 21, however a circuit using only either one of these can also be achieved. Needless to say, adaptations of all types are applicable to the structures described in these specifications. However the polarity may sometimes be different. To apply the example in FIG. 8 describing the application of substrate bias control to the structure in FIG. 20, the PMOS transistor threshold voltage must be raised instead of the NMOS transistor as shown in FIG. 8. The following explanations also describe examples utilizing PMOS transistors as the power switch and current source. Needless to say however, these can be achieved with the configurations (structures) of FIG. 20 or FIG. 21.

There are no limitations on the material or thickness of the gate dielectric for the MOS transistor comprising the power switch. To reduce the on-resistance per surface area of power switch PSW1 during operation, the gate dielectric (film) of the MOS transistor comprising the power switch PSW1 should be thin and the absolute value of the threshold voltage should be made small. However large voltages sometimes cannot be applied to the electrode when the gate dielectric (film) is thin. Also, to reduce the gate tunneling leakage current, a MOS transistor with a gate tunneling current smaller than the combined gate tunneling current of the MOS transistors comprising the circuit block CKT, should be utilized as the power switch PSW1. One structure that satisfies all of these tradeoffs has a thick gate dielectric film for the MOS transistors comprising the power switch PSW1 compared to the MOS transistors comprising the circuit block CKT. This structure further applies a voltage amplitude to the gate terminal of power switch PSW1 that is larger than power supply VDD. Utilizing this structure allows utilizing MOS transistors used in the I/O circuit (input buffer or output buffer) for achieving an interface outside of the chip, in a circuit block CKT integrated onto the chip that holds MOS transistors comprising the power switch PSW1. The MOS transistors used in input buffer or output buffer generally have a high breakdown voltage so they can be utilized because their gate dielectric (film) is thicker than the gate dielectric (film) of the MOS transistors comprising the circuit block. Joint use of the transistors in the power switch and I/O circuit allows reducing the type of MOS transistor gate dielectric used in the overall chip and consequently the cost can be reduced. In this case, the amplitude of the gate signal PSWGATE1 can be the same as the I/O voltage. The on-resistance during operation can in this way be reduced and a power switch with a sufficiently small leakage current during standby can be obtained.

Components with a higher threshold voltage than the MOS transistors comprising the circuit block can also be used in the threshold voltage of the power switch PSW1. The condition Ioff(PSW1)<<I(PSW2) can in this way be easily satisfied and since the VFNL is determined by I(PSW2), the design of the present invention is simple. The gate length of the current source PSW2 can be made thicker than the gate length of the MOS transistor comprising the circuit block CKT. A structure of this type allows lowering variations in the threshold that occur in the process. The size of the leakage current flow in the circuit block current during standby due to process variations can also be reduced.

A structure of the power switch controller PSC is described next.

Figure 22:
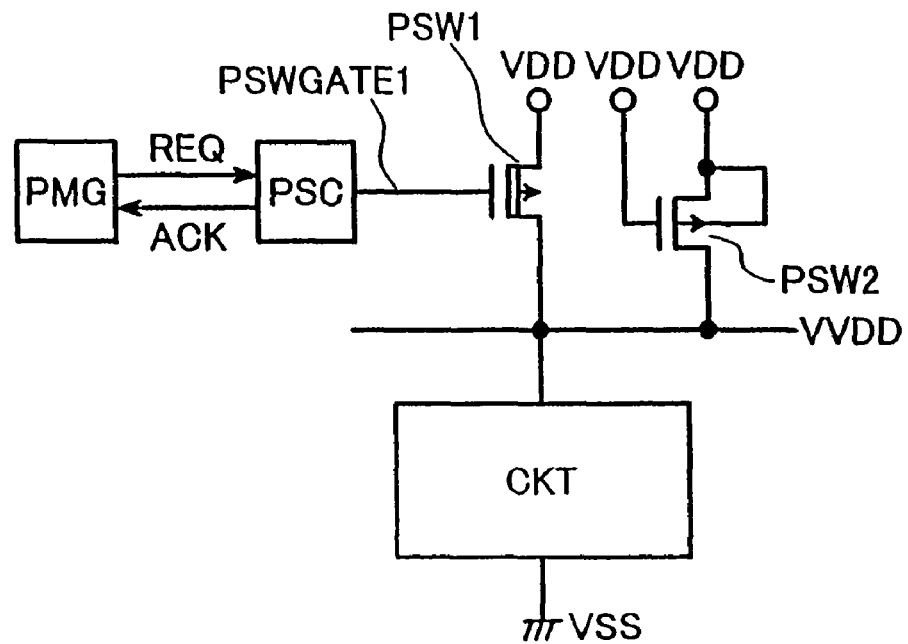
FIG. 22 is a diagram showing a structure of the external interface of the power switch controller.

FIG. 22 is a structure of the interface for the power switch controller PSC. The power switch controller PSC that controls the power switch PSW1 and current source PSW2 implements control by means of a power controlling circuit PMG. This allows designing the circuit block CKT low-leak mechanism separately from the power controlling circuit PMG that reduces power consumption in the chip overall. A handshake between the power controlling circuit PMG and the power switch controller PSC by means of the request line REQ and response line ACK controls the on/off operation of the power switch PSW1 and controls the state of the circuit block. Here, setting the request line REQ to high level turns on the power switch PSW1 and controls the circuit block CKT in the operation state. After the power switch PSW1 turns fully on and the virtual power line VVDD is charged to the voltage potential of power supply VDD, when the response line ACK reaches high level, the external section of the power switch controller (power controlling circuit PMG) is notified that the circuit block CKT has switched to the operation state. Conversely, when the request line REQ is set to low level, the power switch PSW1 turns off and the circuit block is controlled to the standby state. When the power switch PSW1 turns fully off, and the response line ACK switches to low level, the external section of the power switch controller is notified that the circuit block CKT has switched to the standby state.

When the circuit block in a device is used, the circuit block might trigger by mistake if the power switch PSW1 is not in a completely on state. In the structure of FIG. 22, the circuit block shifts to the operation state and the response line ACK detects that the circuit block is completely usable so that misoperation (triggering by mistake) is prevented.

Figure 23:
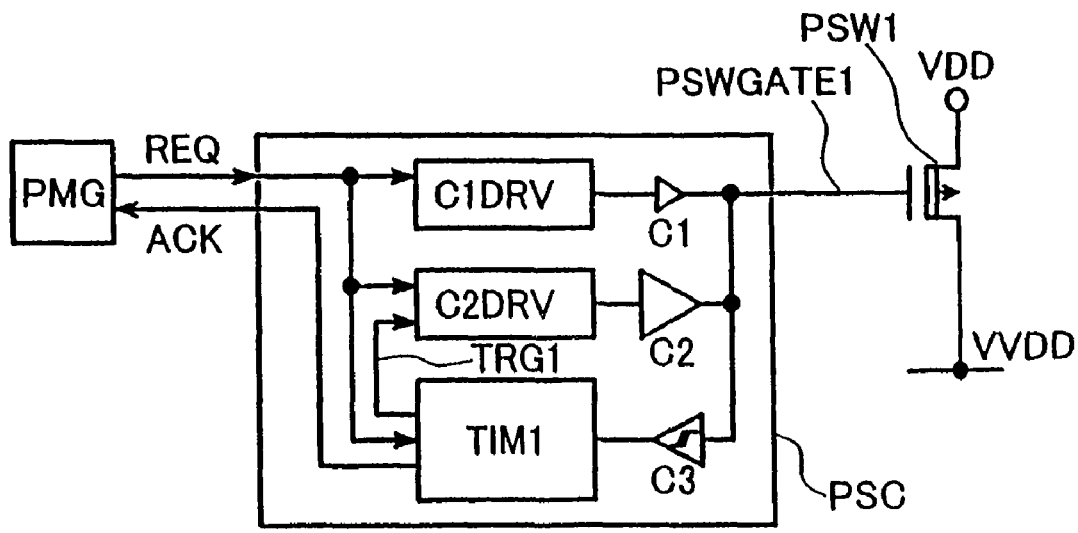
FIG. 23 is a diagram showing the structure of a power switch controller for controlling the slew rate of the virtual voltage line.

FIG. 23 is a more detailed structure of the power switch controller PSC. In the figure, C1 is a drive circuit (hereafter described as a driving circuit with high impedance) for the gate signal PSWGATE1 having small drive performance. Also in the figure, C2 is a drive circuit (hereafter described as a driving circuit with low impedance) for the gate signal PSWGATE1 having drive performance larger than C1. Also in the figure, C3 is a voltage potential detector for the gate signal PSWGATE1, C1DRV is a control circuit for C1, C2DRV is a control circuit for C2 and TIM1 is a timer.

Figure 24:
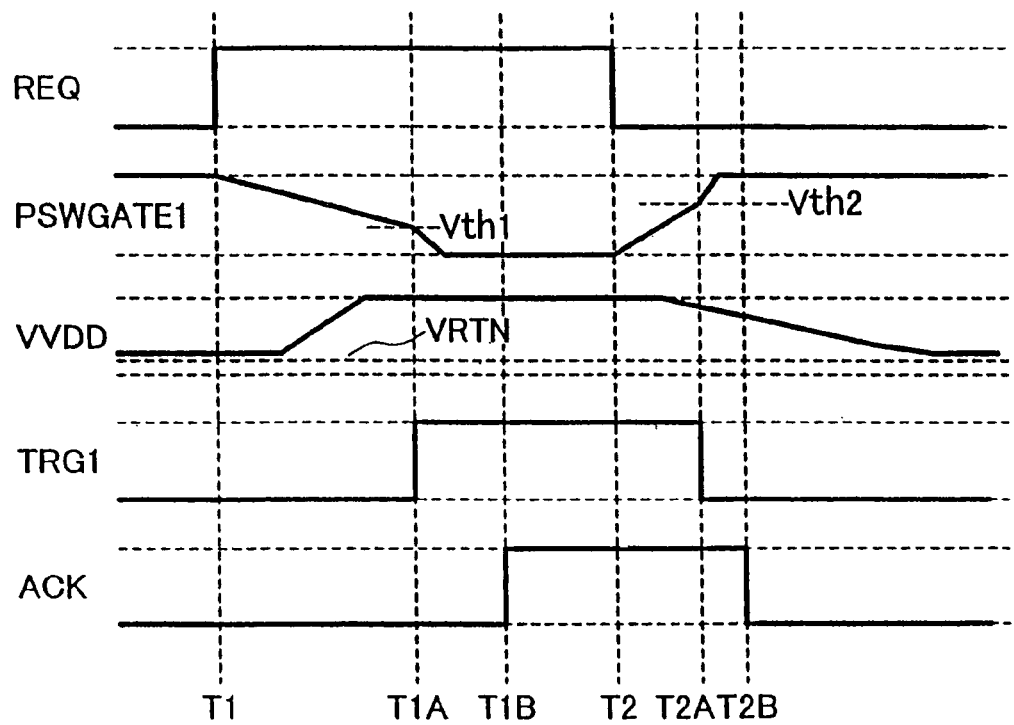
FIG. 24 is a timing chart for the operation of FIG. 23.

FIG. 24 is a timing chart for the operation in FIG. 23. When operation has shifted from standby to the operation state and the request line REQ reaches high level, first of all the gate signal PSWGATE1 is driven to high impedance by C1 by way of the C1DRV control circuit for C1. The potential detector C3 detects that the gate signal PSWGATE1 was driven to a level (Vth1) at time T1A, and TRG1 is driven to high level by the timer TIM1. The gate signal PSWGATE1 is in this way driven to a low impedance by C2 by way of the C2DRV control circuit for C2. The timer TIM1 measures the time TA from time T1 to T1A, and after a time TB established using the specific relation (for example 1/2) with time TA, (time T1B in the example in FIG. 24) the response line ACK is driven to high level. There are no particular restrictions on the timer characteristics (relation between time TA and time TB) however the gate signal PSWGATE1 is driven completely to low level at time T1B. Also the virtual power line VVDD may be fully charged up to the voltage potential of VDD.

When operation has shifted from the operation state to standby state, and the request line REQ reaches low level at time T2.

The gate signal PSWGATE1 is then first of all driven to high impedance by C1, by way of the C1DRV control circuit for C1. The potential detector C3 detects that the gate signal PSWGATE1 was driven to a level Vth2 at time T2A, and TRG1 is driven to low level by the timer TIM1. The gate signal PSWGATE1 is in this way driven to a low impedance by C2 by way of the C2DRV control circuit for C2. Based on the time from time T2 to time T2A, the timer drives the response line ACK to low level after a certain time (time T2B). There are no particular restrictions on the timer characteristics (relation between time TA' from time T2B to time T2A and time TTB' from time T2A to time T2B) and even a time for example of TA'/TB'=2 is satisfactory.

The present invention is characterized in that information is retained (held) within the information retention circuits. Of course this information must be retained when changing from the standby state to the operation state and also when changing from the operation state to the standby state. Information within the information retention circuits might be destroyed due to coupling noise from the virtual power line VVDD during the change from the standby state to the operation state. To eliminate this problem, the structure in FIG. 23 utilizes a driving circuit with high impedance C1 and a driving circuit with low impedance C2 to drive the gate signal PSWGATE1 so the slew rate is reduced. The coupling noise from the virtual power line VVDD is reduced and the information within the information retention circuits can be prevented from being destroyed.

There are no particular restrictions here on the method for setting the slew rate dV/dt of the virtual power line VVDD during the shift from the standby state to the operation state. For example, when the coupling capacitance between the virtual power line VVDD and its memory mode is set to Cp (coupling capacitance), a current Cp*dV/dt flows in the memory node. The slew rate dV/dt may be set to satisfy Imax>Cp*dV/dt when the Imax is set to an upper limit of current flow that will not damage the memory when flowing in the memory node. In FIG. 6 for example, Ion2_n is a general guide for setting Imax. When the inverter input is at high level (voltage is V1) in FIG. 6, and a current larger than Ion2_n is applied to the inverter output, the current becomes larger than the NMOS transistor current (Ion2_n) driving the inverter output voltage to low level. The inverter output cannot then be maintained at low level and malfunctions occur.

Generally, during the shift from standby state to operation state, a large capacitance is required to charge up to the power supply VDD potential when charging the virtual power line VVDD and charging the nodes that are at high level within the circuit block CKT, etc. A large inrush current (voltage surge) might occur in the power supply VDD during this charging. This large inrush current causes voltage drops in the power supply VDD, and creates the hazard that other circuits using the power supply VDD might malfunction. In the structures in FIG. 2 and FIG. 3, the slew rate of the virtual power supply line VVDD is small so that the circuit can slowly charge to a large capacitance. Therefore the inrush current can be reduced and operation malfunctions can be prevented.

Figure 25:
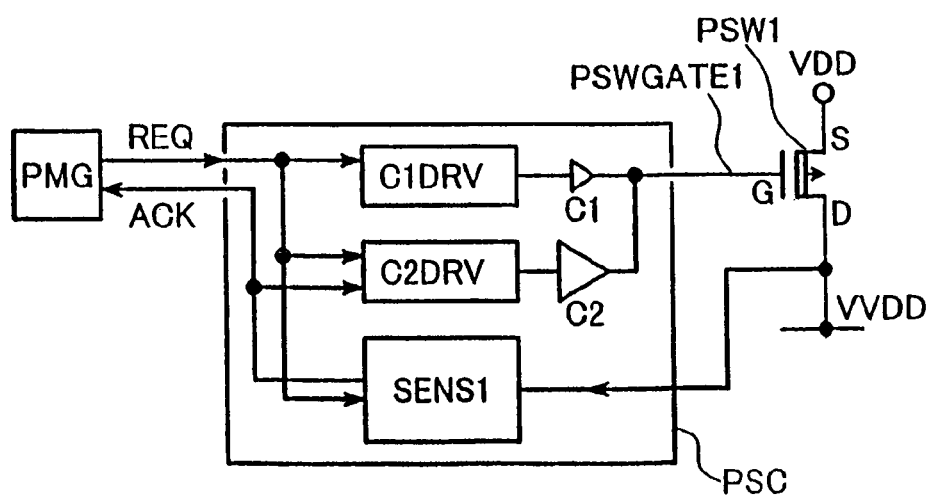
FIG. 25 is a diagram of a structure for another power switch controller for controlling the slew rate of the virtual voltage line.

In the structure in FIG. 25, the voltage potential of the gate signal PSWGATE1 is detected as shown in the example in FIG. 23. Also rather than generating a response line ACK using a timer, the voltage of the virtual power line VVDD is detected and a response line ACK generated. Here, SENS1 is the potential detector for the virtual voltage line SENS1.

Figure 26:
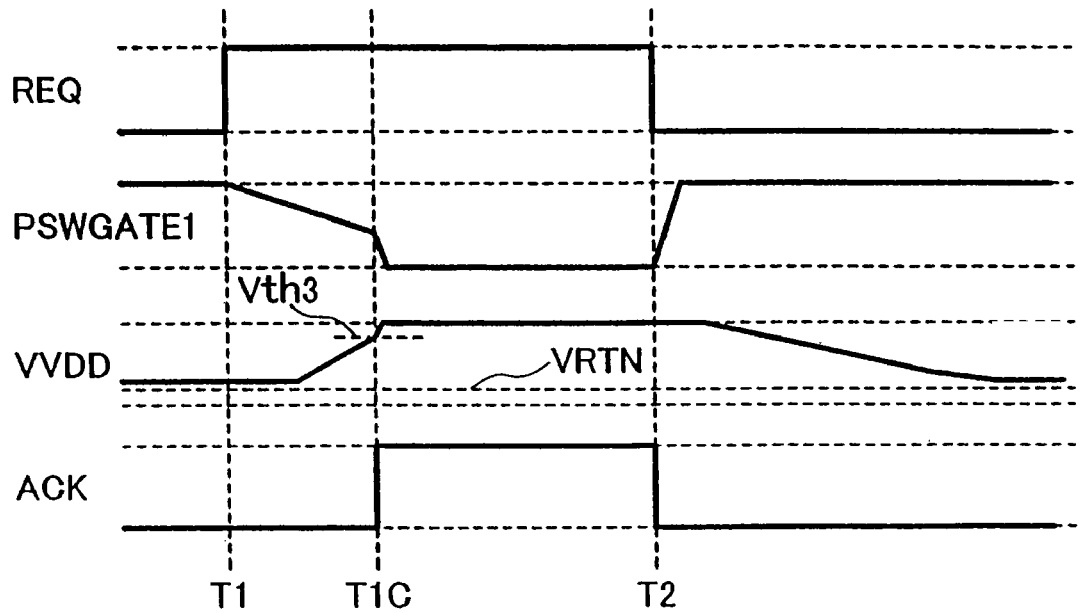
FIG. 26 is a timing chart for the operation in FIG. 25.

FIG. 26 is a timing chart for the operation in FIG. 25. During the shift from standby state to operation state, when the request line REQ sets to high level at time T1, the gate signal PSWGATE1 is driven to a high impedance by C1 by way of the C1DRV control circuit for C1. The SENS1 potential detector for virtual voltage line VVDD detects that it has been driven to a level Vth3 at time T1C and drives the response line ACK to high level. At the same time, the gate signal PSWGATE1 is driven to a low impedance by C2 by way of the C2DRV control circuit for C2. During the shift from operation state to standby state, when the request line REQ sets to low level at time T2, the gate signal PSWGATE1 is driven to a high impedance by C1 by way of the C1DRV control circuit for C1; and the gate signal PSWGATE1 is driven to a low impedance by C2 by way of the C2DRV control circuit for C2.

Figure 27:
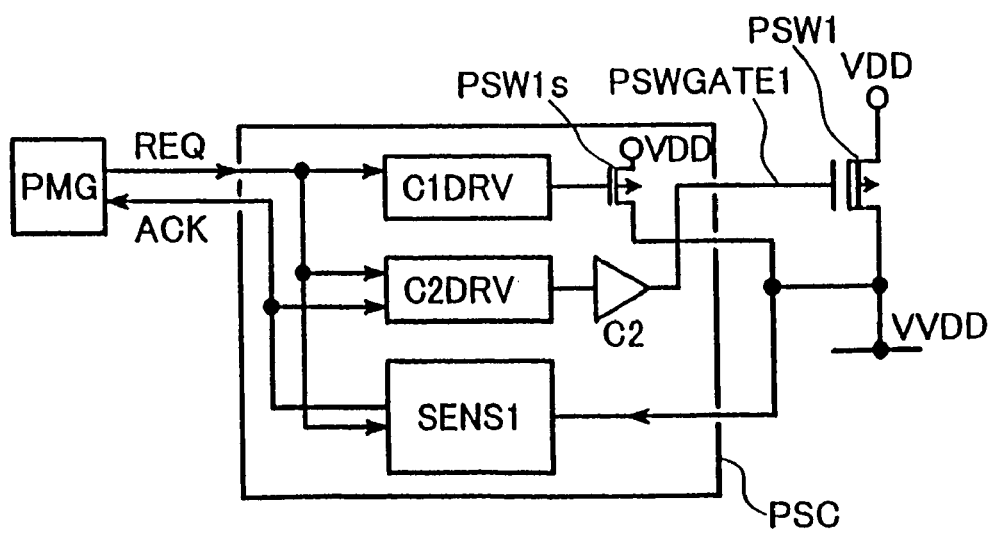
FIG. 27 is a diagram of a structure for another power switch controller for controlling the slew rate of the virtual voltage line.
Figure 28:
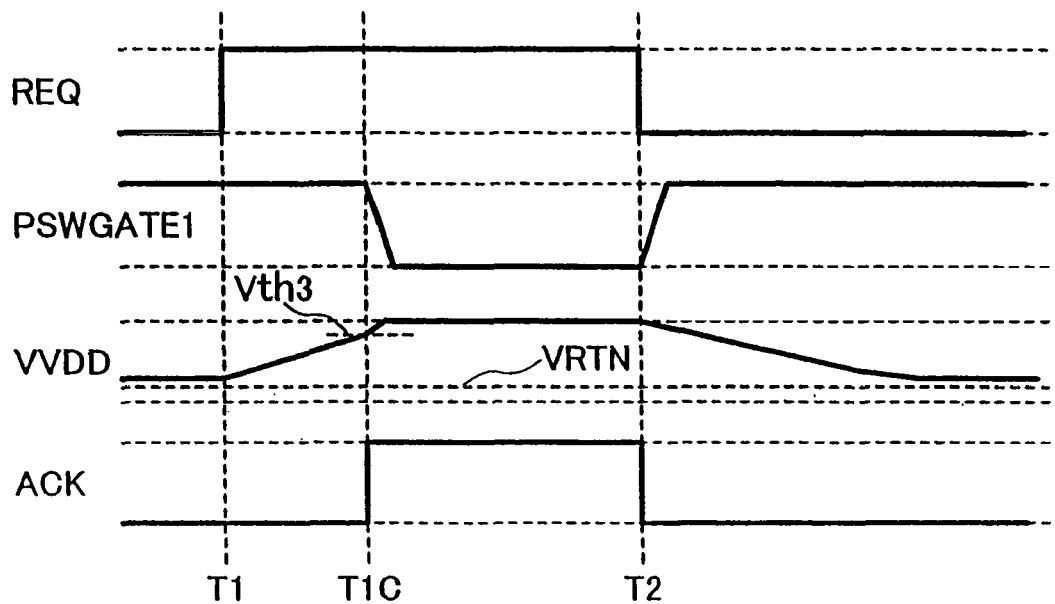
FIG. 28 is a timing chart for the operation in FIG. 27.

In FIG. 27, the driving of the virtual power line VVDD during the shift from standby state to operation state is performed by a power switch PSW1s separate from the power switch PSW1. The power switch PSW1s has small (surface area is also small) drive power compared to the power switch PSW1. FIG. 28 is a timing chart for the operation in FIG. 27. During the shift from the standby state to the operation state, first of all the power switch PSW1s is turned on by way of the C1DRV control circuit for C1, when the request line REQ reaches high level at time T1. The SENS1 potential detector for virtual voltage line detects that the line has been driven to a level Vth3 at time T1C and drives the response line ACK to high level. At the same time, the gate signal PSWGATE1 is driven to a low impedance by C2 by way of the C2DRV control circuit for C2. During the shift from operation state to standby state, when the request line REQ sets to low level at time T2, the power switch PSW1s is turned off by the C1DRV control circuit for C1; and the gate signal PSWGATE1 is driven to a low impedance by C2 by way of the C2DRV control circuit for C2. In this way, in the structure of FIG. 27, the virtual power line VVDD is driven utilizing a small power switch PSW1s and the slew rate of the virtual power line VVDD is controlled.

Figure 29:
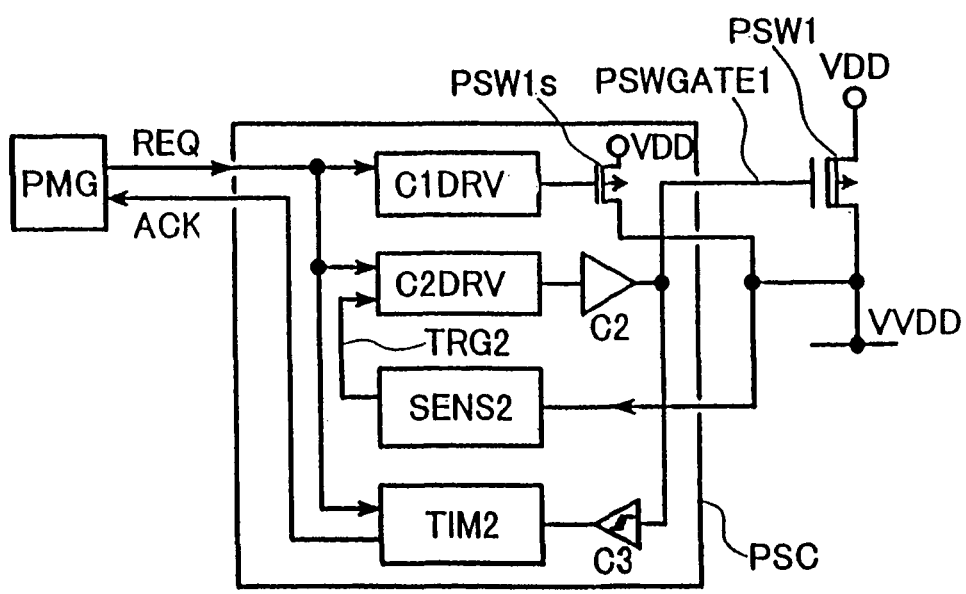
FIG. 29 is a diagram of a structure for another power switch controller for controlling the slew rate of the virtual voltage line.
Figure 30:
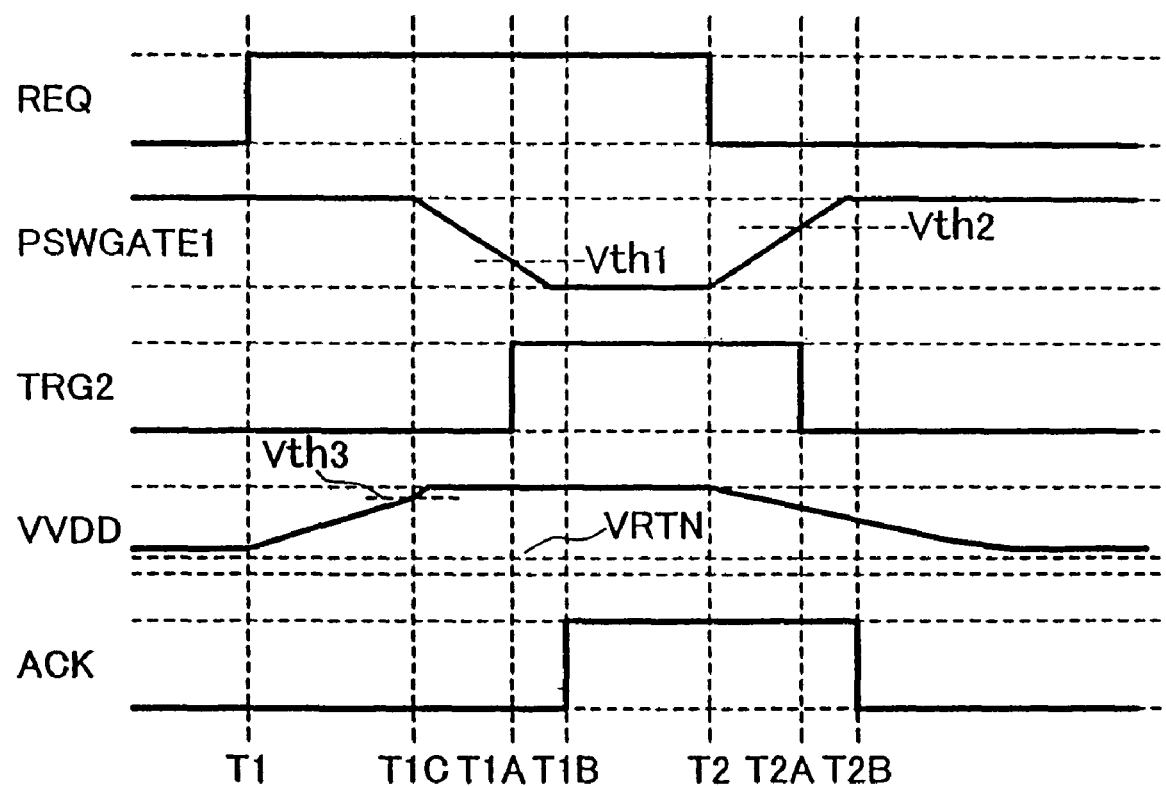
FIG. 30 is a timing chart for the operation in FIG. 29.

The structure shown in FIG. 29 is a combination of the method for generating the response line ACK signal of FIG. 23 and the slew rate control for the virtual power line VVDD of FIG. 27. Here, SENS2 is a potential detector for the virtual voltage line, and TIM2 is a timer. FIG. 30 is a timing chart for the operation. During the shift from the standby state to the operation state, when the request line REQ sets to high level at time T1, first of all the power switch PSW1s turns on by way of the C1DRV control circuit. The SENS2 potential detector for the virtual voltage line detects that the virtual voltage line has been driven to a level Vth3 at time T1C, and drives the gate signal PSWGATE1 to low level by means of C2 by way of the C2DRV control circuit for C2. The potential detector C3 detects that the gate signal PSWGATE1 been driven down to level Vth1 at time T1A, and TRG2 is driven to high level by the SENS2 potential detector.

The timer TIM2 drives the response line ACK to high level after a certain time (time T1B) based on the time from time T1C to time T1A. There are no particular restrictions on the timer characteristics (relation of time TA from time T1C to time T1A, with the time TB from time T1A to time T1B). However, the gate signal PSWGATE1 may be driven to a completely low level at time T1B, and further the virtual voltage line VVDD may be charged fully up to power supply VDD, and may for example even be TA/TB=2. During the shift from operation state to the standby state, when the request line REQ sets to low level at time T2, first of all the power switch PSW1s is turned off by the C1DRV control circuit, and the PSWGATE1 is driven to low impedance by C2, by way of the C2DRV control circuit for C2. The potential detector C3 detects that the gate signal PSWGATE1 been driven up to a level Vth2 at time T2A, and the output of SENS2, TRG2 is driven to low level when SENS2 detects that VVDD is driven to a certain level Vth3 at time T1C. The timer TIM2 drives the response line ACK to low level after a certain time (time T2B) based on the time from time T2 to time T2A. There are no particular restrictions on the timer characteristics (relation of time TA' from time T2B to time T2A, with the time TB' from time T2A to time T2B) and for example even TA'/TB'=2 is satisfactory.

The structure of the power supply controller PSC was described above. The structure is characterized in that the voltage of the power switch PSW1 and the virtual power supply line VVDD are controlled so that information can be retained within the information retention circuits when shifting from standby state to operation state, and when shifting from the operation state to standby state.

Second Embodiment

Examples of specific circuits applicable to the power control method of the present invention are described next.

Figure 31:
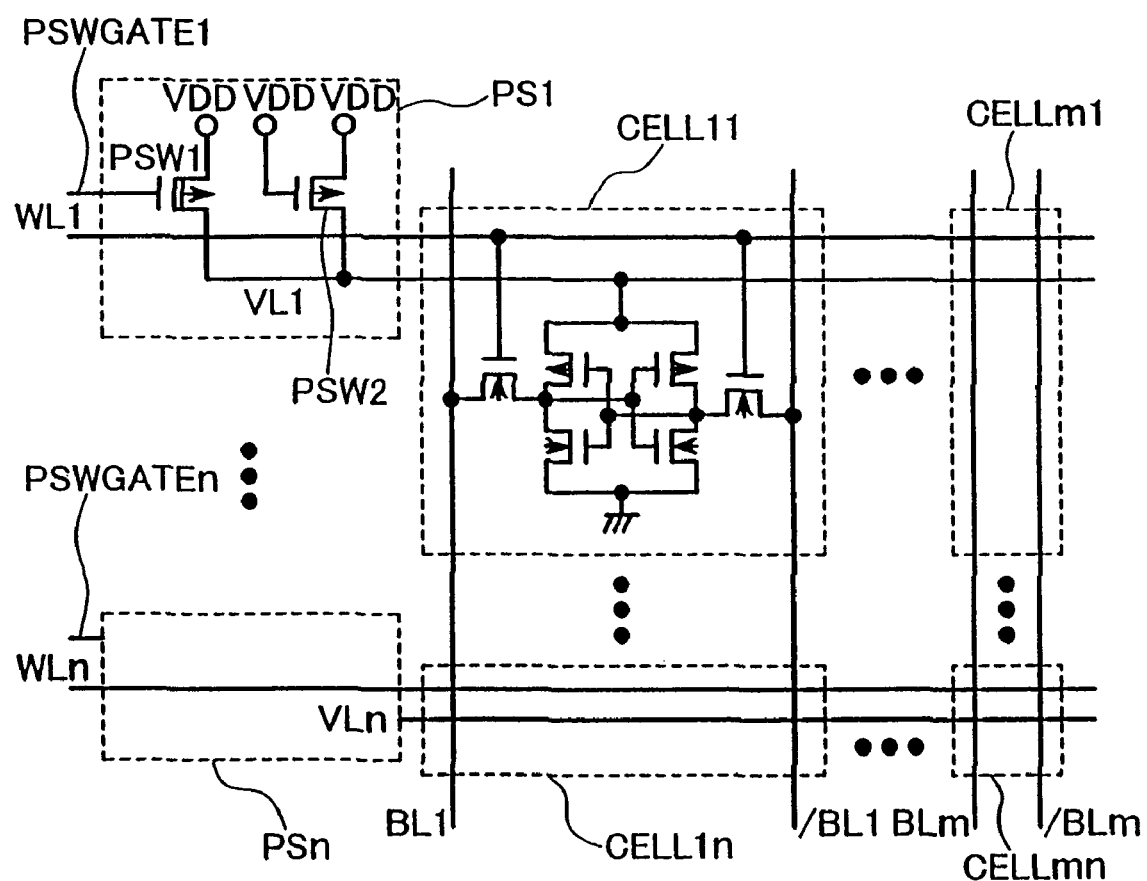
FIG. 31 is a diagram showing the structure of the static memory of the present invention.

FIG. 31 is a circuit diagram of static memories applicable to the present invention. In the figure, CELL 11 through CELLm1 and CELL1n through CELLmn are static memory cells, BL1 through BLm are the bit lines, /BL1 through /BLm are auxiliary signals for the bit lines BL1 through BLm, and WL1 through WLn are word lines. Here, PS1 through PSn are virtual power control circuits and include the power switch PSW1 and current source PSW2. The virtual power line connecting the word line WL1 to the memory cells (CELL11 through CELLm1) is VL1. The virtual power line connecting the word line WLn to the memory cells (CELL in through CELLmn) is VLn.

Figure 32:
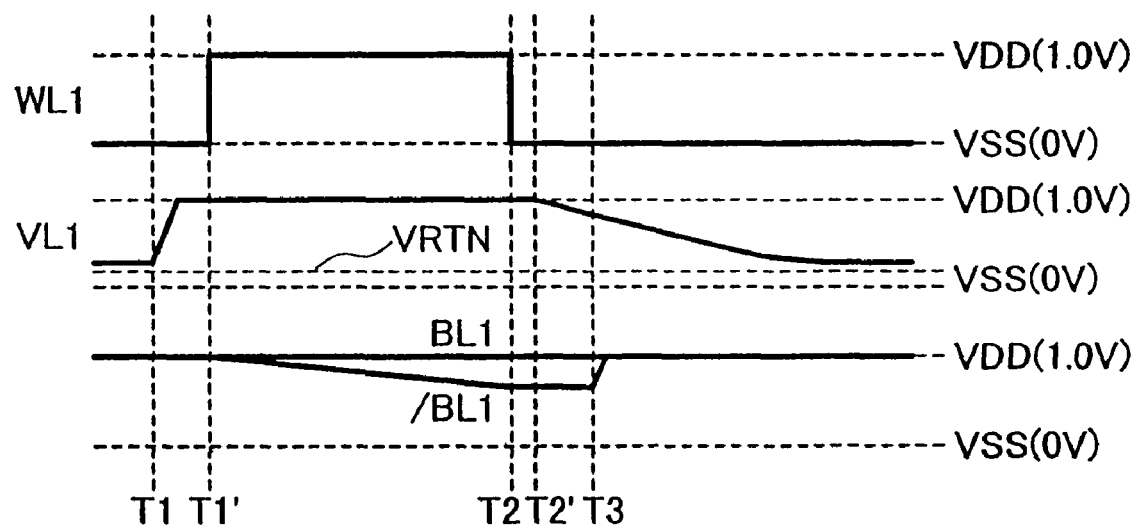
FIG. 32 is a timing chart for the operation in FIG. 31.

FIG. 32 is a timing chart for the operation in FIG. 31. The virtual power line VL1 of the memory cell is driven up to the power supply VDD by the virtual power control circuits PS1 at time T1. After the virtual power line VVDD voltage has been driven completely up to the power supply VDD voltage, the word line WL1 is driven to high level at time T1'. The bit lines from BL1 through BLm as well as from /BL1 through /BLm are driven by the memory cells CELL11 through CELLm1 selected by means of word line WL1. The information within the memory cells is expressed in the bit lines. Though not shown in FIG. 31 for purposes of simplicity, the information in those bit lines is amplified by the sensing amp connected to the bit line. Information stored within the memory cell is in danger of being destroyed if the word line is driven to high level in the period while the virtual power line VVDD voltage has not been driven completely to the power supply VDD voltage potential. However, in the present invention there is no danger of the information being destroyed.

The word line WL1 is driven to low level at time T2 and then the power switch PSW1 turns off at time T2'. The leakage reduction method of the present invention is in this way capable of using the current source PSW2 to reduce the leakage current flowing in the memory cell while still retaining information stored within the memory cell. The information stored in the memory cell is in danger of being destroyed by current flow from the bit line unless the virtual power line voltage is discharged after checking that the word line was driven to low level. However, in the present invention there is no danger of the information being destroyed. Though not shown in FIG. 31 for purposes of simplicity, a bit line equalizer is connected to each of the bit line pairs from BL1 and /BL1 and bit line pairs BLm and /BLm. These bit lines are equalized to the voltage potential of power supply VDD by the bit line equalizer at time T3.

When the gate tunneling leakage of the memory cell is too large to be ignored, the bit line may then be driven to a voltage lower than the power supply VDD during standby (when the word line is at low level). The voltage across the gate-source of the memory cell transfer transistor can in this way be reduced and the gate tunneling leakage current flowing that transfer transistor can be reduced. In this case of course, the bit line voltage must be driven to the power supply VDD voltage as in FIG. 32 before the word line is driven to high level at time T1 (This is called bit line reset operation.) Needless to say this reset operation is unnecessary if a method to VSS precharge the bit line is used. In the example in FIG. 33 there is no need to reset the bit line even if the bit line is VDD precharged.

Figure 33:
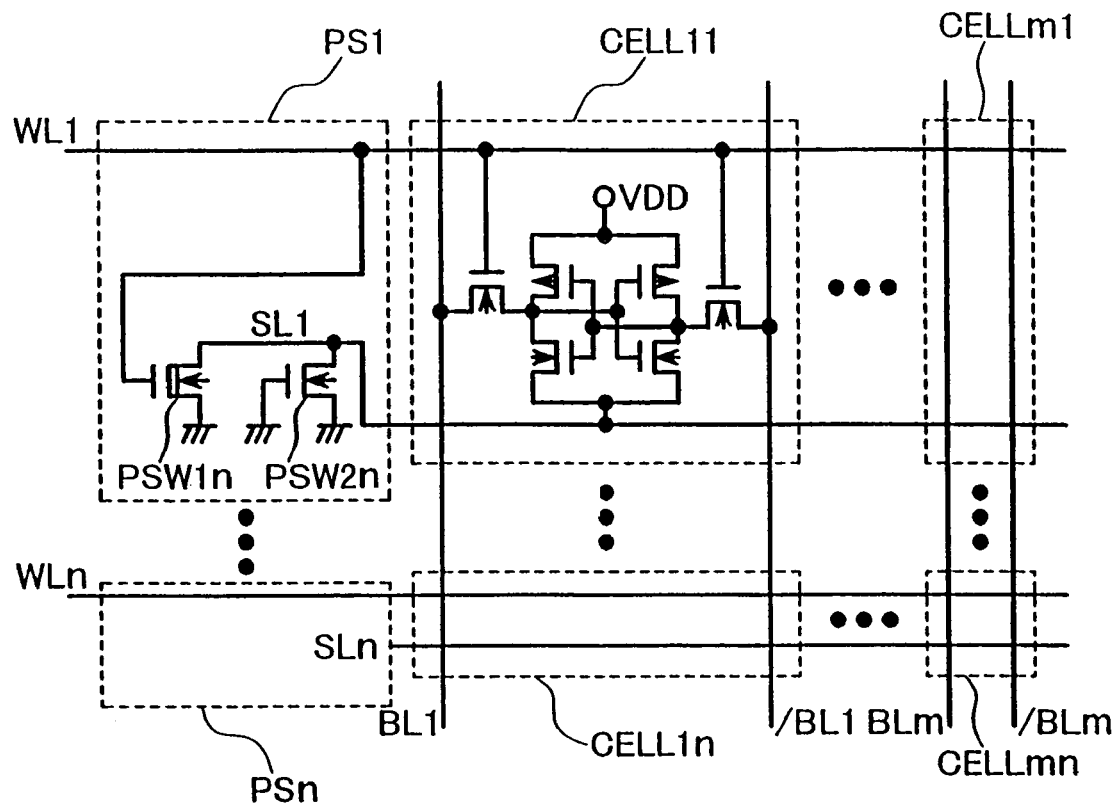
FIG. 33 is a diagram showing another structure of the static memory of the present invention.

The structure in FIG. 33 is composed of a power switch utilizing NMOS transistors instead of the power switch composed of PMOS transistors in FIG. 31. Here, PS1 through PSn are the virtual power control circuits of the present invention and contain the current source PSW2n and the power switch composed of NMOS transistors. The virtual ground line for the memory cells (CELL11 through CELLm1) connected to the word line WL1 is SL1. The virtual ground line for the memory cells (CELL1n through CELLmn) connected to the word line WLn is SLn.

Figure 34:
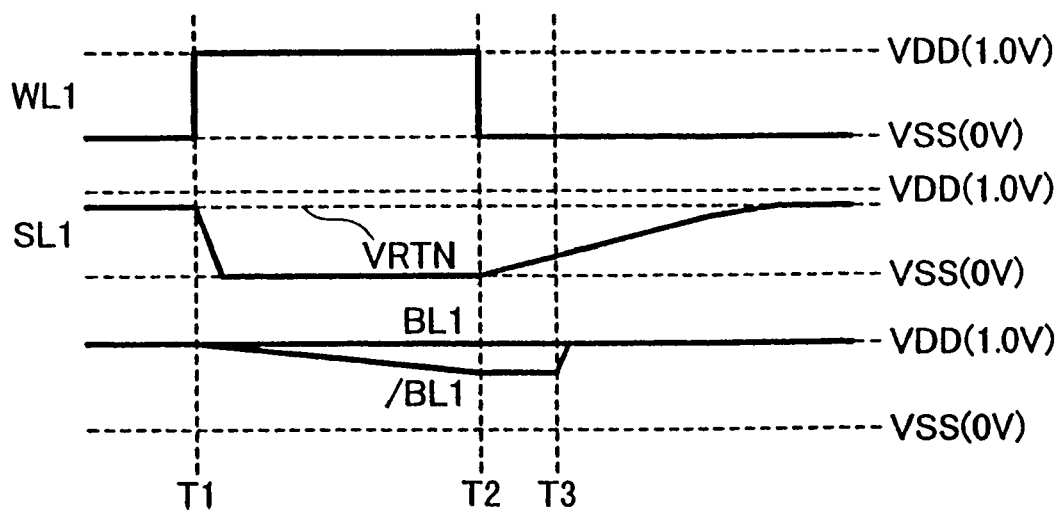
FIG. 34 is a timing chart for the operation in FIG. 33.

FIG. 34 is a timing chart for the operation in FIG. 33. Simultaneous with driving the word line WL1 to high level at time T1, the virtual ground line SL1 of the memory cell connected to that word line is driven to ground VSS by the virtual power control circuit PS1. The bit lines from BL1 through BLm as well as from /BL1 through /BLm are driven by the memory cells CELL11 through CELLm1 selected by means of word line WL1. The information within the memory cells is expressed in the bit lines. Though not shown in FIG. 33 for purposes of simplicity, the information in those bit lines is amplified by the sensing amp connected to the bit line. In FIG. 31, the word line is driven to high level after the virtual power line VDD voltage is driven completely up to power supply VDD voltage potential. However, in the timing chart of FIG. 34, the virtual ground line VVSS and the word line WL may be driven simultaneously. This may be performed because there is no danger of the information stored within the memory cell being damaged by current from the bit word line. In fact, the virtual ground line VVSS can be completely driven to ground potential before the word line is driven to high level so that both drive operations can overlap and memory cell readout can be performed at high speed.

The power switch PSW1n turns off when the word line WL1 is driven to low level at time T2. The present invention can in this way reduce the leakage current flowing in the memory cell while still maintaining the information stored in the memory cell by the current source PSW2. Though not shown in FIG. 33 for purposes of simplicity, a bit line equalizer is connected to each of the bit line pairs of BL1 and /BL1 and the bit line pairs BLm and /BLm. Along with simultaneously driving the word line WL1 to low level at time T2, the bit lines are driven to the voltage potential of power supply VDD by this bit line equalizer.

In the timing chart of FIG. 34, the word line is at VSS voltage potential prior to time T1 and after time T2. However, the word line may also be driven below VFNL or above the VSS voltage potential so that GIDL and gate tunneling leakage current does not flow. The word line WL1 low level may be at virtual ground line SL1 voltage potential and in the same way the word line WL2 low level may be at virtual ground line SL2 voltage potential. The ground of the word line driver can for example be achieved from the virtual ground line in this way.

The power supply voltage applied to the memory cell in FIG. 31 and FIG. 33 may be raised higher than the power supply voltage applied to the sensing amp. In this case also, the precharge level of the bit line may be the same voltage as the power supply voltage applied to the sensing amp. The gate dielectric (film) thickness of the MOS transistor comprising the memory cells in this case is preferably thicker than the gate dielectric (film) thickness of the MOS transistor comprising the sensing amp. Of course, the precharge level of the bit line may also be the same as the power supply voltage applied to the memory cells. In this case, the sensing amp inputs and amplifies a voltage higher than its own power supply voltage so if the gate dielectric (film) thickness of the MOS transistor comprising the sensing amp is thinner than the gate dielectric (film) thickness of the MOS transistor comprising the memory cells, then the sensing amp will need MOS transistors capable of reducing the applied voltage (i.e. having a high breakdown voltage).

Of course the various adaptations and specific examples disclosed for structures of the first embodiment are also applicable to the current source switches PS1 through PSn in the structures of the second embodiment.

Third Embodiment

Figure 35:
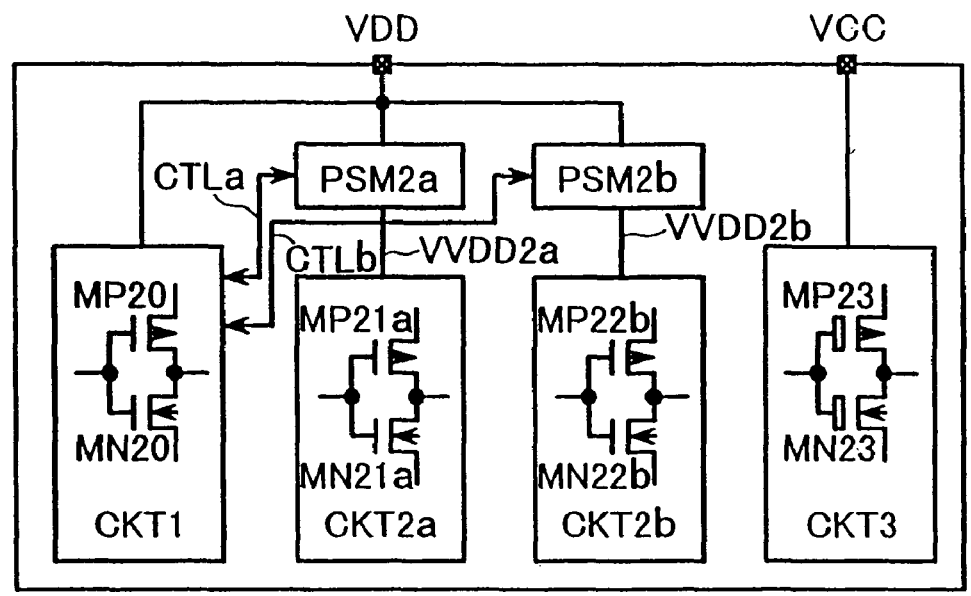
FIG. 35 is a circuit diagram showing the structure of the chip of the present invention.

FIG. 35 is a block circuit diagram of the chip CHP1 structure of the present invention. Most of the signal wiring and power supply grounds have been omitted from the drawing for simplicity. The circuit block CKT1 is a circuit block supplied with power directly from a power supply VDD and not by way of the leakage reduction circuit of the present invention. Circuit blocks CKT2a and CKT2b are circuit blocks supplied with power from the power supply VDD by way of the leakage reduction circuits PSM2a and PSM2b of the present invention. The circuit block CKT3 is a circuit block is supplied with power directly from a power supply VCC different from the power supply VDD and not by way of the leakage reduction circuit of the present invention. In the figure, MP20, MP21a, MP22b and MP23 are PMOS transistors. Also in the figure, MN20, MN21a, MN22b, MN23 are NMOS transistors. In the same figure, CTLa, CTLb are leakage control lines of the leakage reduction circuit of the present invention and equivalent to the request line REQ and response line ACK of FIG. 22. The circuit block CKT1 in FIG. 35 is a circuit requiring that power be constantly applied. These for example are circuits to control the leakage reduction circuits PSM2a and PSM2b, real time clocks (RTC), interrupt handling circuits, a DRAM refresh circuit, a memory, etc. The circuit block CKT3 is an I/O circuit. The power supply VCC is a power supply for interface with sections external to the chip. This power supply VCC is a voltage higher than the power supply VDD. For example, the VCC voltage may be 3.3 volts or 2.5 volts versus a VDD voltage of 1.8 volts. The gate dielectric (film) thickness of the MOS transistors MP23 and MN23 comprising the input buffer and output buffer are thicker than the gate dielectric thickness of the other MOS transistors.

By establishing multiple leakage control circuits as in FIG. 35, and controlling the leakage current of circuits grouped in multiple circuits integrated onto the chip, the leakage current of the overall chip can be efficiently reduced.

Figure 36:
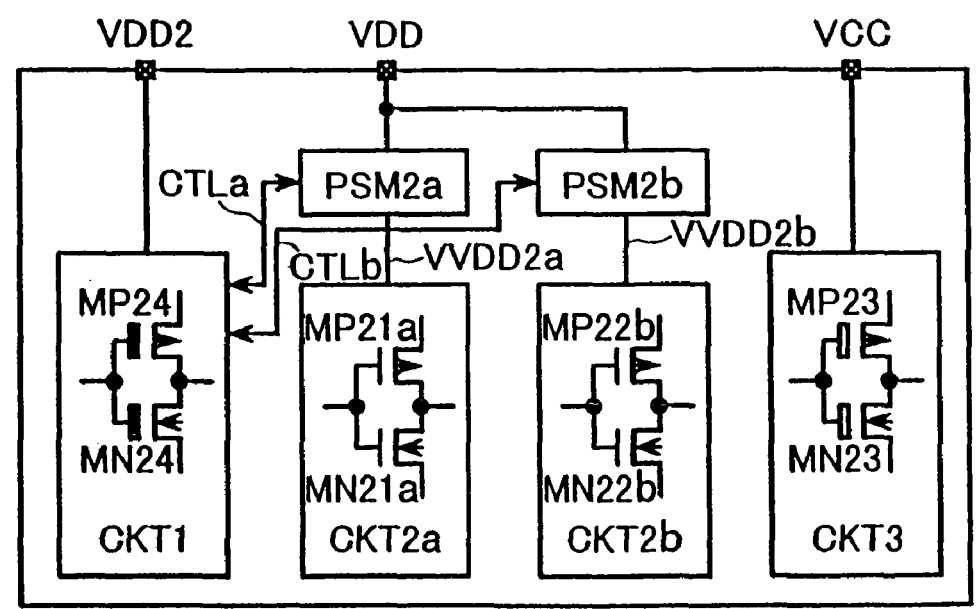
FIG. 36 is a circuit diagram showing the structure of the chip when input from a three-type power supply.

The circuit diagram in FIG. 36 is a structure for supplying the power supply of circuit block CKT1, and the power supply of circuit block CKT2a and CKT2b from separate power supply terminals. The circuit block CKT1 as described above is a circuit requiring that power be continuously applied for operation. Applying the leakage current reduction method of the present invention will have little effect on this circuit. However, the circuit comprising the circuit block CKT1 is the circuit described in the explanation for FIG. 35, and the operating frequency required for that circuit should in many cases be lower than the operating frequency required in circuits contained in the circuit blocks CKT2a and CKT2b. Therefore, when using the same MOS transistors in circuit block CKT1 and circuit blocks CKT2a and CKT2b, the power consumption due to leakage current versus power consumption due to operating current in the current block CKT1 becomes drastically large compared to that in circuit block CKT2. To prevent this it is preferable to raise the threshold voltage in the MOS transistors comprising the current block CKT1. This may also be accomplished by setting the circuit block CKT1 and CKT2 to the same gate dielectric thickness, or changing the channel impurities (doping) or changing the substrate bias value. The thickness of the gate dielectric of the MOS transistors of circuit block CKT2 may also be made thicker than the gate dielectric of the MOS transistors of circuit block CKT1. In this case, it is preferable to raise the voltage of power supply VDD2 applied to the current block CKT1 to a voltage higher than power supply VDD. The leakage current of the entire chip can in this way be efficiently reduced. The thickness of MOS transistor gate dielectric may be made thicker in the order of: MOS transistors comprising circuit block CKT2a or CKT2b, MOS transistors comprising circuit block CKT1, and the MOS transistors comprising circuit block CKT3. The MOS transistors comprising the circuit block CKT1 may also be the same gate dielectric thickness as the MOS transistors comprising circuit block CKT3.

Figure 37:
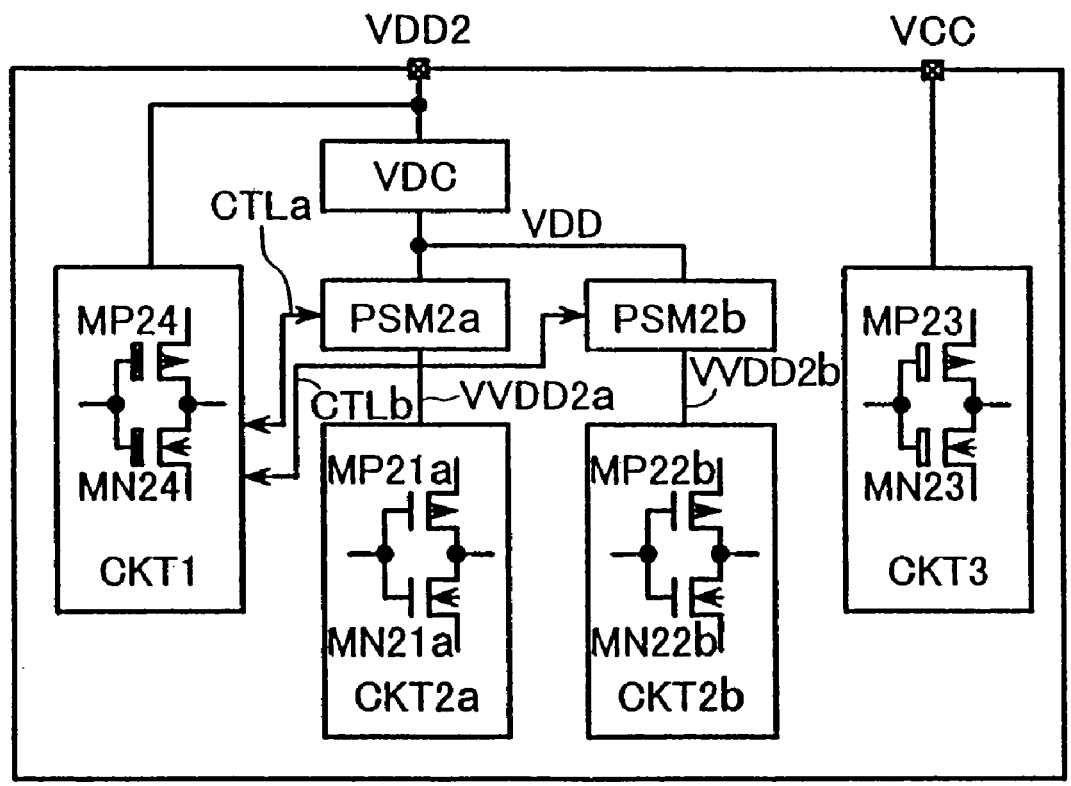
FIG. 37 is a circuit diagram showing the structure of the chip one power supply having an internal voltage regulator.

FIG. 37 is a structure showing when the power supply VDD has been made to drop lower than the power supply VDD2 voltage, when the voltage of the VDD2 power supply in FIG. 36 has been raised to a voltage higher than the power supply VDD. Here, VDC is the voltage regulator circuit. There are no particular restrictions on this regulator circuit and a series regulator may be utilized or a switching regulator may be utilized. The various types of power supplied to the chip may be reduced.

Figure 38:
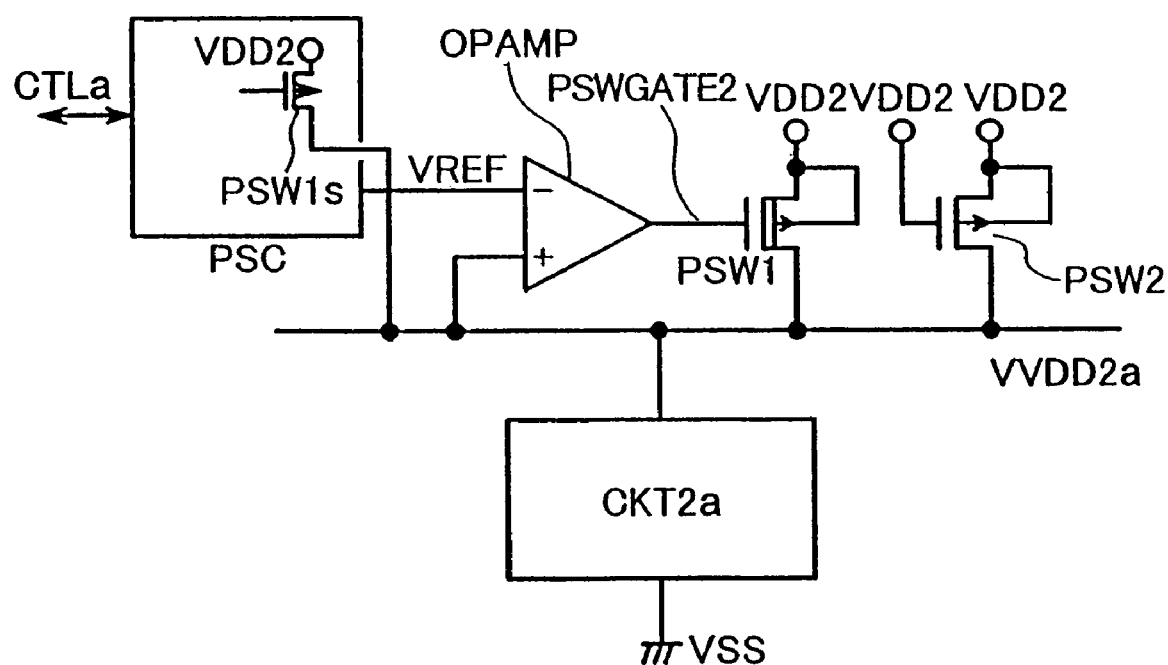
FIG. 38 showing a combination of power switch and voltage regulator.

The voltage regulator VDC and leak regulator circuit PSM2a or PSM2b components in the example in FIG. 37 can be combined together. That structure is shown in FIG. 38. In the figure, PSW2 is the current source, OPAMP is the operational amplifier and VREF is the reference voltage. During operation, a voltage VDD can be supplied to the virtual power line VVDD2a by applying voltage VDD to VREF. To turn the power switch PSW1 off, VREF may be set to a sufficiently low voltage (for example below 0 volts). The power switch PSW1s has smaller drive power than the power switch PSW1. This is utilized for reducing noise during the shift from the standby state to operation state. The operating method is the same as the operating method relating to FIG. 27. Even here, there are no particular restrictions on the threshold voltage or gate dielectric thickness of the power switch PSW1s, however an optimal selection should be made according to the voltage of VDD.

The voltage regulator circuit can monitor the virtual power line VVDD2a or VVDD2b voltages and may regulate voltage by applying the desired VDD voltage to the virtual power line even if the current consumption is large in circuit blocks CKT2a and CKT2b. When the circuit path from the power supply terminal of the chip to the circuit within the circuit block has a high impedance, a so-called IR drop occurs due to current consumption of the circuit block CKT2a or CKT2b. This IR drop can be prevented by the above described formula. The virtual power line VVDD2a or VVDD2b voltages can also be changed based on the information on variations (non-uniformities) in chip manufacture or information on environmental fluctuations, and the characteristics (or properties) of the circuit block CKT2a or CKT2b that changed due to these variations or fluctuation can be corrected.

The structure of FIG. 38 can also utilize the method for applying the voltage VFNL to the virtual power line VVDD during standby as in the structure in FIG. 17. The PSW2 of FIG. 38 is not required in this case. Two types of control methods may be used in this case. In the first method, the VDD voltage is applied to VREF during operation as described above, and the power supply voltage VDD is applied to the virtual power line VVDD2a. During standby the VFNL (<VDD) voltage is applied to VREF, and the voltage VFNL is supplied to the virtual power line VVDD2a. The voltage source VFNLGEN was required by the structure of FIG. 17, however this structure (FIG. 38) has the advantage of being able to use an operational amplifier OPAMP and power switch PSW1 instead. In the second method, besides the operational amplifier OPAMP and power switch PSW1, the voltage source VFNLGEN is installed on the virtual power line VVDD2a. During operation, a voltage VDD is applied to VREF as described above, and a voltage VDD is supplied to the virtual power line VVDD2a. During standby, 0 volts is applied to VREF, and the voltage VFNL is supplied to the virtual power line VVDD2a from the voltage source VFNLGEN.

Either method has the advantage that the virtual power line VVDD2a voltage during standby can be made a voltage close to VRTN by directly applying VFNL to the virtual power line VVDD2a during standby state. The value of the directly applied VFNL voltage can also be directly controlled according to the voltage of power supply VDD, the temperature and process conditions, etc.

Figure 39:
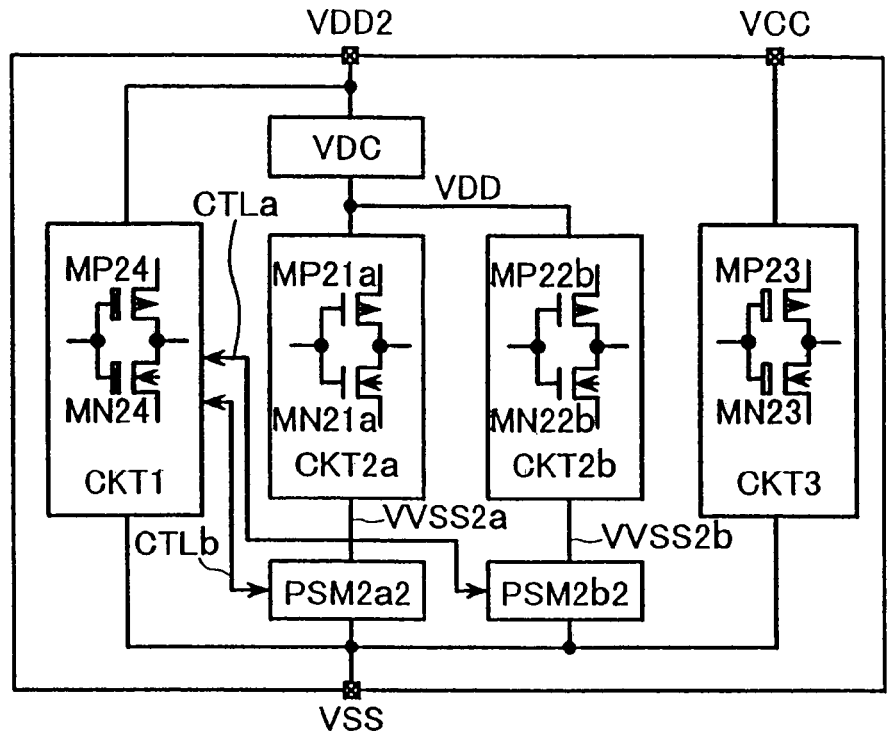
FIG. 39 is a circuit diagram showing a chip composed of a power switch utilizing NMOS transistors.

The examples in the structures from FIG. 35 to FIG. 38 utilized PMOS transistors in the power switch. However, an NMOS transistor PSW1n may also be used as the above described power switch. FIG. 39 is the structure of FIG. 37 but with leakage control circuits PSM2a2 and PSM2b2 using NMOS transistors as the power switch. Generally, NMOS transistors have small on-resistance per gate width as compared with PMOS transistors. The structure of FIG. 39 can more easily suppress a drop in speed in the circuit block during the operation state then can the structure in FIG. 37.

Of course the various adaptations and specific examples disclosed for the first embodiment are also applicable to the leakage current reduction circuit of the third embodiment.

Figure 40:
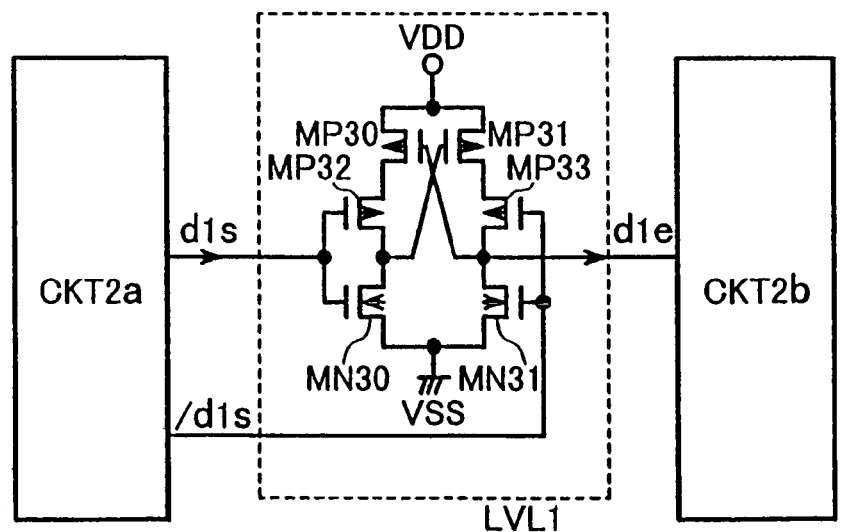
FIG. 40 is a circuit diagram showing the structure of the latch level conversion circuit of the present invention.

The signal transfer circuits between the circuit blocks have been omitted from FIG. 35 through FIG. 39. During standby, the voltage supplied to the circuits within the block is reduced when using the current leakage reduction method of the present invention. The amplitude of the signals output from that circuit is therefore also reduced. Level converter circuits must be installed between the circuit blocks to transfer these small amplitude signals to other circuit blocks without causing abnormal current flow. The structure of a level conversion circuit is shown in FIG. 40. In the figure, MP30, MP31, MP32, MP33 denote PMOS transistors and MN30, MN31 denote NMOS transistors. There are no particular restrictions on the threshold voltage and gate dielectric thickness of the transistors.

When the circuit block CKT2a is in standby with the current leakage reduction method of the present invention, the signal amplitude of d1s and its complementary signal are reduced compared to the signal amplitude of VDD during the operation state. However, this is amplified up to the power supply VDD voltage by the latch level conversion circuit LVL1 in the structure of FIG. 40 and output as d1e. Signals can be exchanged without abnormal current flow occurring even if the CMOS circuit input with die is supplied with the power supply voltage of VDD.

The toggle frequency of the latch type level shifter LVL1 is greatly dependent on the input signal amplitude. However, when the input amplitude of the latch type level shifter LVL1 has become small, the circuit (circuit block CKT2a) outputting that signal is in the standby state and the logic level input signal cannot be toggled. The latch type level shifter LVL1 therefore need only amplify the signal amplitude high enough to maintain (keep) the logic levels so a drop in toggle frequency is not a problem.

The deep stand-by state described in FIG. 18 and FIG. 19 is implemented in the circuit block CKT2a. During standby, when d1s and /d1s are in a floating state, abnormal current flow might occur in the latch type level shifter LVL1. To prevent that abnormal current flow, a method for example, as disclosed in JP-A-11195975/1999 may be utilized. Also, FIG. 40 is an effective latch-level shifter structure utilizing PMOS transistors as the power switch shown in FIG. 1. When using NMOS transistors as the power switch of FIG. 20, a latch type level shifter as in FIG. 40 can be utilized as the complimentary type latch-level shifter.

Specific examples were described based on the embodiments of the invention rendered by the inventors. However the present invention is not limited to these examples and needless to say, different types of changes and adaptations may be implemented without departing from the scope and spirit of the invention. For example, different types of changes can be made in the specific structure of the circuits and the structural layout.

What is claimed is:

1. A semiconductor integrated circuit device comprising:
   a first power line whose potential is a first potential;
   a second power line whose potential is a second potential lower than the first potential;
   a third power line whose potential is a third potential lower than the second potential;
   a first MOS transistor connected between the second power line and the third power line;
   a circuit block connected between the first power line and the second power line; and
   a drive control circuit comprising a first drive circuit and a second drive circuit, wherein the drive control circuit controls a voltage supplied to a gate of the first MOS transistor,
   wherein the first MOS transistor is off in a standby state,
   wherein the first MOS transistor is on in a operation state;
   wherein during a shift from the standby state to the operation state, the drive control circuit changes the voltage supplied to the gate of the first MOS transistor at a first rate, and then, changes the voltage supplied to the gate of the first MOS transistor at a second rate faster than the first rate, wherein a driving performance of the first drive circuit is smaller than the driving performance of the second drive circuit, wherein an output of the first drive circuit and an output of the second drive circuit are commonly connected to the gate of the first MOS transistor, and wherein the first MOS transistor is a NMOS transistor.

2. The semiconductor integrated circuit device according to claim 1, wherein during the shift from the standby state to the operation state, the second drive circuit drives the gate of the first MOS transistor after the first drive circuit drives the gate of the first MOS transistor to a predetermined voltage level.

3. The semiconductor integrated circuit device according to claim 1, further comprising:

a request line; and a potential detector, wherein the first drive circuit drives the gate of the first MOS transistor when the request line reaches a first high level, and wherein the second drive circuit drives the gate of the first MOS transistor when the potential detector detects that the gate of the first MOS transistor is driven to a predetermined voltage level.

4. The semiconductor integrated circuit device according to claim 3, further comprising:

a timer; and a response line, wherein the response line is driven to a second high level when the timer detects the passage of a predetermined time from the time when the potential detector detects that the gate of the first MOS transistor is driven to the predetermined voltage level.

5. The semiconductor integrated circuit device according to claim 1, further comprising:

a potential detector, wherein the second drive circuit drives the gate of the first MOS transistor when the potential detector detects that the second power line is driven to a predetermined voltage level.

6. The semiconductor integrated circuit device according to claim 5, further comprising:

a response line, wherein the response line is driven to a high level when the potential detector detects that the second power line is driven to the predetermined voltage level.

7. The semiconductor integrated circuit device according to claim 1, further comprising:

a current source, wherein the current source is connected between the second power line and the third power line, and wherein the circuit block comprises an information retention circuit which is a circuit with a volatile information retention function.

8. The semiconductor integrated circuit device according to claim 7, wherein the information retention circuit is either one of a flip-flop or a memory cell array.

9. A semiconductor integrated circuit device comprising:

a first power line whose potential is a first potential;

a second power line whose potential is a second potential lower than the first potential;

a third power line whose potential is a third potential lower than the second potential;

a first MOS transistor connected between the second power line and the third power line;

a circuit block connected between the first power line and the second power line; and a drive control circuit comprising a first drive circuit and a second drive circuit, wherein the drive control circuit controls a voltage supplied to a gate of the first MOS transistor, wherein the first MOS transistor is off in a standby state, wherein the first MOS transistor is on in a operation state, wherein during a shift from the operation state to the standby state, the drive control circuit changes the voltage supplied to the gate of the first MOS transistor at a first rate, and then, changes the voltage supplied to the gate of the first MOS transistor at a second rate faster than the first rate, wherein a driving performance of the first drive circuit is smaller than the driving performance of the second drive circuit, wherein an output of the first drive circuit and an output of the second drive circuit are commonly connected to the gate of the first MOS transistor, and wherein the first MOS transistor is a NMOS transistor.

10. The semiconductor integrated circuit device according to claim 9, wherein during the shift from the operation state to the standby state, the second drive circuit drives the gate of the first MOS transistor after the first drive circuit drives the gate of the first MOS transistor to a predetermined voltage level.

11. The semiconductor integrated circuit device according to claim 10, further comprising:

a request line; and a potential detector, wherein the first drive circuit drives the gate of the first MOS transistor when the request line reaches a low level, and wherein the second drive circuit drives the gate of the first MOS transistor when the potential detector detects that the gate of the first MOS transistor is driven to a predetermined voltage level.

12. The semiconductor integrated circuit device according to claim 11, further comprising:

a timer; and a response line, wherein the response line is driven to a low level when the timer detects the passage of a predetermined time from the time when the potential detector detects that the gate of the first MOS transistor is driven to the predetermined voltage level.

13. The semiconductor integrated circuit device according to claim 9, further comprising:

a current source, wherein the current source is connected between the second power line and the third power line; and wherein the circuit block comprises an information retention circuit which is a circuit with a volatile information retention functions.

14. The semiconductor integrated circuit device according to claim 13, wherein the information retention circuit is either one of a flip-flop or memory cell array.

* * * * *